US012701774B2

(12) United States Patent
Huang et al.

(10) Patent No.: US 12,701,774 B2
(45) Date of Patent: Aug. 4, 2026

(54) METHOD OF FORMING SEMICONDUCTOR DEVICE

(71) Applicant: TAIWAN SEMICONDUCTOR MANUFACTURING COMPANY, LTD., Hsinchu (TW)

(72) Inventors: Shao-Tse Huang, Hsinchu City (TW); Jin-Hao Jhang, Hsinchu County (TW); Wei-De Ho, Hsinchu City (TW); Han-Yu Lin, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 396 days.

(21) Appl. No.: 18/398,702

(22) Filed: Dec. 28, 2023

(65) Prior Publication Data

US 2025/0221012 A1     Jul. 3, 2025

(51) Int. Cl.
*H10D 84/03*        (2025.01)
*H10D 84/01*        (2026.01)
*H10P 95/00*        (2026.01)

(52) U.S. Cl.
CPC ....... *H10D 84/038* (2025.01); *H10D 84/0186* (2025.01); *H10D 84/0188* (2025.01); *H10P 95/06* (2026.01)

(58) Field of Classification Search
CPC ............. H10D 84/038; H10D 84/0186; H10D 84/0188; H10D 84/0167; H10P 95/06
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2018/0366583 | A1* | 12/2018 | Kim ..................... H10D 30/797 |
| 2019/0148539 | A1* | 5/2019 | Yang ..................... H10D 30/62 257/401 |

(Continued)

*Primary Examiner* — Mounir S Amer
(74) *Attorney, Agent, or Firm* — Maschoff Brennan

(57) ABSTRACT

A method includes a number of operations. A bottom transistor and a top transistor overlapping the bottom transistor are formed. A vertical local interconnect (VLI) structure is formed and electrically connects source/drain regions of the bottom transistor and the top transistor. A hard mask layer is formed over the VLI structure, wherein the hard mask layer includes a bottom nitride layer, a top nitride layer and an amorphous semiconductive layer directly between the bottom nitride layer and the top nitride layer. The hard mask layer is patterned. A trench is formed in the VLI structure. An isolation structure is formed in the trench. A first polishing process is performed to the isolation structure and the hard mask layer, wherein the first polishing process stops the amorphous semiconductive layer. A second polish process is performed to the isolation structure, the bottom nitride layer and the amorphous semiconductive layer.

20 Claims, 28 Drawing Sheets

(56)            References Cited

U.S. PATENT DOCUMENTS

| | | | |
|---|---|---|---|
| 2019/0165155 A1* | 5/2019 | Chang | H10D 30/62 |
| 2023/0307285 A1* | 9/2023 | Huang | H10W 10/014 |
| 2025/0063792 A1* | 2/2025 | You | H10D 84/0147 |
| 2025/0113596 A1* | 4/2025 | Huang | H10D 62/155 |
| 2025/0126829 A1* | 4/2025 | Kang | H10D 30/611 |

* cited by examiner

METHOD OF FORMING SEMICONDUCTOR DEVICE

BACKGROUND

As the semiconductor industry further progresses into sub-10 nanometer (nm) technology process nodes in pursuit of higher device density, higher performance, and lower costs, challenges from both fabrication and design issues have led to stacked device structure configurations, such as complementary field effect transistors (C-FET) where an n-type multi-gate transistor and a p-type multi-gate transistor are stacked vertically, one over the other. While existing C-FET structures are generally adequate, they are not satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
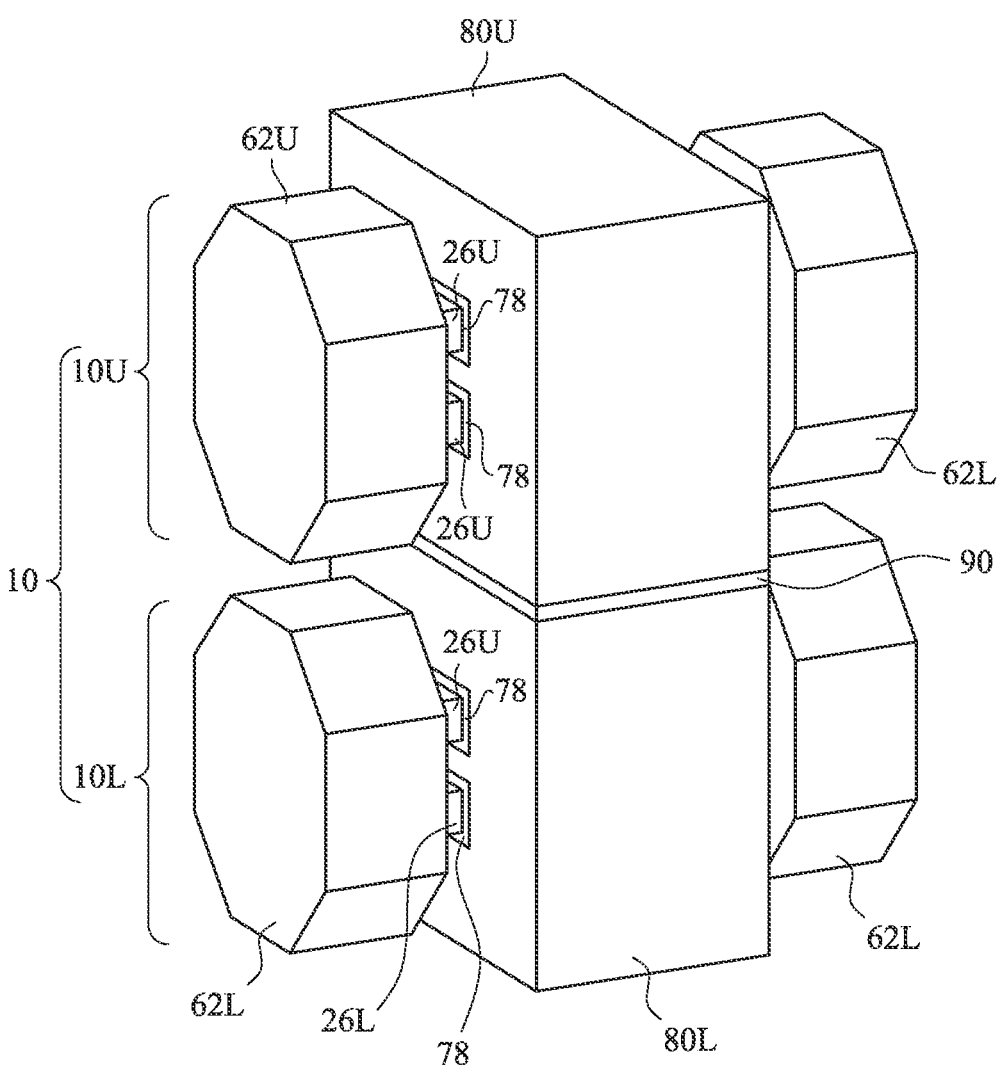
FIG. 1 illustrates a three-dimensional view of an example CFET structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated. One skilled in the art will realize, however, that the values or ranges recited throughout the description are merely examples, and may be reduced or varied with the downscaling of the integrated circuits.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is generally related to a semiconductor device of a Complementary Field-Effect Transistor (CFET) structure. While Gate-All-Around (GAA) transistors (such as nanostructure-FETs) are discussed, the concept of the present disclosure can also be applied to the formation of other types of transistors such as planar transistors, Fin Field-Effect Transistors (FinFETs), or the like. Furthermore, in the illustrated examples, the upper FETs are PFETs, and lower FETs are NFETs, while in other embodiments, upper FETs may also be NFETs, and the lower FETs may be PFETs.

The CFET structure offers a promising opportunity to significantly reduce the integrated circuit footprint. In some embodiments, the CFET structure includes a bottom transistor and a top transistor, which overlap and are electrically connected via a vertical local interconnect (VLI) structure, which may be a vertical and diagonal local interconnect for connecting an epitaxial structure of the top transistor to an epitaxial structure of the bottom transistor. However, the VLI structure presents challenges, particularly in occupying a large metal area. The increased metal area results in a consequential rise in capacitance and a decrease in the speed performance for the CFET structure. One particular hurdle is the processing for reducing the VLI's occupied area. In some embodiments, the VLI metal structure may be recessed into an "L-shaped" structure to reduce its area. However, this processing may be employ a thick hard mask layer, which may inadvertently cause unintended loss on the VLI structure and gate height variation for the top transistor, mainly due to the prolonged process time for the thick hard mask layer.

To address these issues, the present disclosure, in various embodiments, offers a solution in the form of a sandwich-like hard mask layer specifically designed for both the formation and the reduction of the VLI structure. The sandwich-like hard mask layer may include a thin bottom mask layer, a polish stop layer over the thin bottom mask layer, and a protective layer over the polish stop layer. During the polishing process, the polish rate for each layer varies, allowing the process to stop precisely at the polish stop layer. A subsequent polishing step, having less selectivity between the polish stop layer and the thin bottom mask layer, can then be performed. This avoids unintended damage to the VLI structure and prevents gate height variation in the top transistor. Additionally, the polish of the thin bottom mask layer can be easily stopped, thanks to its short polishing time. In some embodiments, the polish stop layer includes amorphous silicon, and the protective layer over the polish stop layer may be an oxygen-free mask layer to prevent the polish stop layer from oxidizing.

FIG. 1 illustrates an example of CFETs 10 (including FETs (transistors) 10U and 10L) in accordance with some embodiments. FIG. 1 is a three-dimensional view, wherein some features of the CFETs are omitted for illustration clarity.

The CFETs include multiple vertically stacked FETs. For example, a CFET may include a lower nanostructure-FET 10L of a first device type (e.g., n-type/p-type) and an upper nanostructure-FET 10U of a second device type (e.g., p-type/n-type) that is opposite the first device type. The nanostructure-FETs 10U and 10L include semiconductor nanostructures 26 (including lower semiconductor nanostructures 26L and upper semiconductor nanostructures 26U), where the semiconductor nanostructures 26 act as the channel regions for the nanostructure-FETs. The lower semiconductor nanostructures 26L are for the lower nanostructure-FET 10L, and the upper semiconductor nanostructures 26U are for the upper nanostructure-FET 10U.

Gate dielectrics 78 encircle the respective semiconductor nanostructures 26. Gate electrodes 80 (including a lower gate electrode 80L and an upper gate electrode 80U) are over the gate dielectrics 78. Source/drain regions 62 (including lower source/drain regions 62L and upper source/drain regions 62U) are disposed on opposing sides of the gate dielectrics 78 and the respective gate electrodes 80. The source/drain region may refer to a source or a drain, individually or collectively dependent upon the context. Isolation features (not shown) may be formed to separate desired ones of the source/drain regions 62 and/or desired ones of the gate electrodes 80.

FIGS. 2A through 2E illustrate the top view and cross-sectional views of an intermediate stage in the formation of CFETs in accordance with some embodiments. FIGS. 2A through 2E illustrate cross-section views of FIG. 2A. FIGS. 2A through 2E illustrate patterning a hard mask layer 150 and forming a trench 110 over a substrate 20. A plurality of nanostructures includes nanostructures 26U, 26M, and 26L over a plurality of semiconductor strips 20' of the substrate 20. A plurality of gate stacks 90 are formed over the nanostructures. The source/drain epitaxial source/drain regions 62 are formed at the two sides of the nanostructures and the gate stacks 90.

The substrate 20 may be a semiconductor substrate, such as a bulk semiconductor, a semiconductor-on-insulator (SOI) substrate, or the like, which may be doped (e.g., with a p-type or an n-type dopant) or undoped. Other substrates, such as a multi-layered or gradient substrate may also be used. In some embodiments, the semiconductor material of the substrate 20 may include silicon, germanium, carbon-doped silicon, an III-V compound semiconductor; or the like, or combinations thereof.

In some embodiments, the multi-layer stack used to form the nanostructures 26U, 26M and 26L may include alternating dummy semiconductor layers and semiconductor layers, which includes lower semiconductor layers 26L and upper semiconductor layers 26U used to form the nanostructures for forming a lower FET and an upper FET, respectively. Appropriate wells (not separately illustrated) may be formed in lower semiconductor layers 26L and upper semiconductor layers 26U. For example, semiconductor layers 26L and 26U may be in-situ doped (when epitaxially grown) and/or implanted to desirable conductivity types. The semiconductor layers 26 (including the lower semiconductor layers 26L and upper semiconductor layers 26U) are formed of one or more semiconductor material(s). The semiconductor material(s) may be selected from the candidate semiconductor materials of the substrate 20. The lower semiconductor layers 26L and the upper semiconductor layers 26U may be formed of the same semiconductor material, or may be formed of different semiconductor materials. In some embodiments, dummy semiconductor layers are formed of or comprise silicon germanium and the semiconductor layers 26L and 26U are formed of silicon. It should be appreciated that the multi-layer stack may include any number of the dummy semiconductor layers and the semiconductor layers 26L and 26U. Each layer of the multi-layer stack may be grown by a process such as Vapor Phase Epitaxy (VPE) or Molecular Beam Epitaxy (MBE), deposited by a process such as Chemical Vapor Deposition (CVD) process or an Atomic Layer deposition (ALD) process, or the like.

The nanostructures 26U, 26M and 26L and the semiconductor strips 20' may be formed by patterning the substrate 20 and the multi-layer stack of the alternating dummy semiconductor layers and the semiconductor layers. In some embodiments, the substrate 20 and the multi-layer stack of the alternating dummy semiconductor layers and the semiconductor layers may be patterned by forming a dummy gate stack as a masking layer. An etching process may be isotropic and may be selective to the material of the dummy semiconductor layers between the nanostructures 26U, 26M and 26L, so that the dummy semiconductor layers are etched at a faster rate than the semiconductor nanostructures 26U, 26M and 26L. In this manner, the dummy semiconductor layers may be completely removed from between the lower semiconductor nanostructures 26L (collectively), the middle nanostructures 26M (collectively) and the upper semiconductor nanostructures 26U (collectively). The lower semiconductor nanostructures 26L, the middle nanostructures 26M and the upper semiconductor nanostructures 26U may be further collectively referred to as semiconductor nanostructures 26.

The patterning process may be performed by any suitable method. For example, the patterning process may include one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one or mor embodiments, a sacrificial layer is formed over a substrate and patterned using a photolithography process. Spacers are formed alongside the patterned sacrificial layer using a self-aligned process. The sacrificial layer is then removed, and the remaining spacers may then be used as an etching mask for the patterning process.

The lower semiconductor nanostructures 26L will act as channel regions for lower nanostructure-FETs of the CFETs. The upper semiconductor nanostructures 26U will act as channel regions for upper nanostructure-FETs of the CFETs. The middle semiconductor nanostructures 26M are the semiconductor nanostructures 26 that are immediately above/below (e.g., in contact with) the dummy semiconductor layer. The middle semiconductor nanostructures 26M may be used for isolation and may or may not act as channel regions for the CFETs. The dummy semiconductor layer immediately above/below the middle semiconductor nanostructures 26M will be subsequently replaced with isolation structures. The isolation structures and the middle semiconductor nanostructures 26M may define boundaries of the lower nanostructure-FETs and the upper nanostructure-FETs.

Isolation regions 32 are formed over the substrate 20 and around the semiconductor strips 20'. Isolation regions 32 may include a dielectric liner and a dielectric material over the dielectric liner. Each of the dielectric liner and the dielectric material may include an oxide such as silicon oxide, a nitride, such as silicon nitride, the like, or a combination thereof. The formation of isolation regions 32 may include depositing the dielectric layer(s), and performing a planarization process such as a Chemical Mechanical Polish (CMP) process, a mechanical polishing process, or the like to remove excess portions of the dielectric materials. The deposition processes may include ALD, High-Density Plasma CVD (HDP-CVD), Flowable CVD (FCVD), the like, or a combination thereof. In some embodiments, the isolation regions 32 include silicon oxide formed by an FCVD process, followed by an anneal process.

Figure 2A:
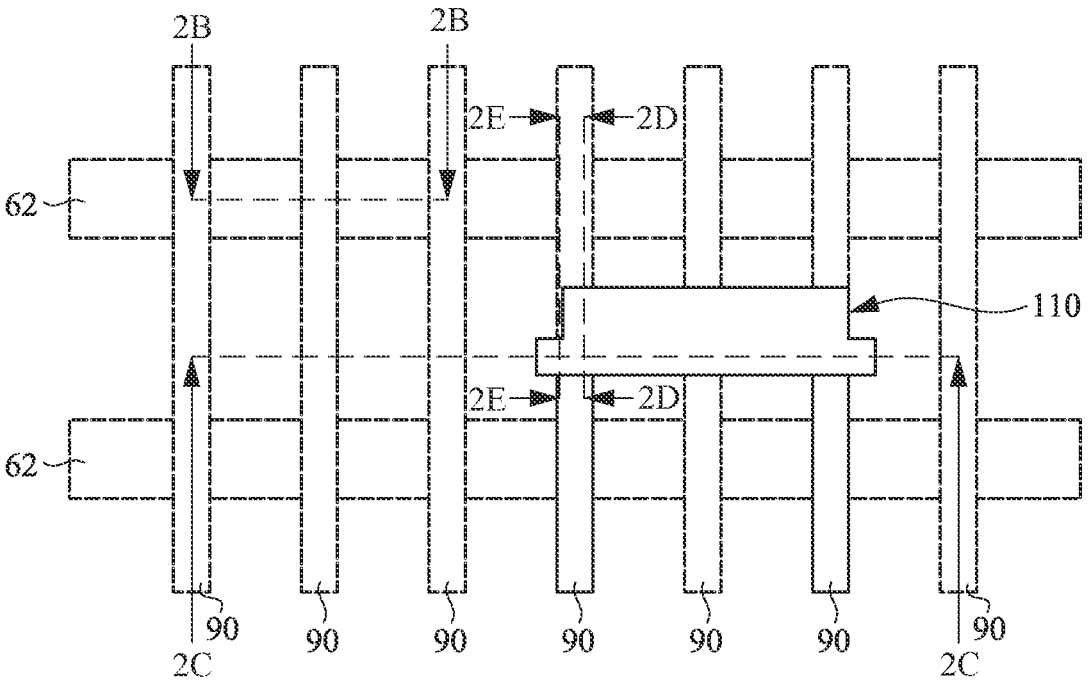
FIGS. 2A through 10D illustrates schematic top views and cross-sectional views of intermediate stages in the formation of CFETs in accordance with some embodiment.

The isolation regions 32 are recessed after formation of the isolation regions 32. Some upper portions of the semiconductor strips 20' protrude higher than the remaining isolation regions 32, as illustrated in FIG. 2D.

Figure 2B:
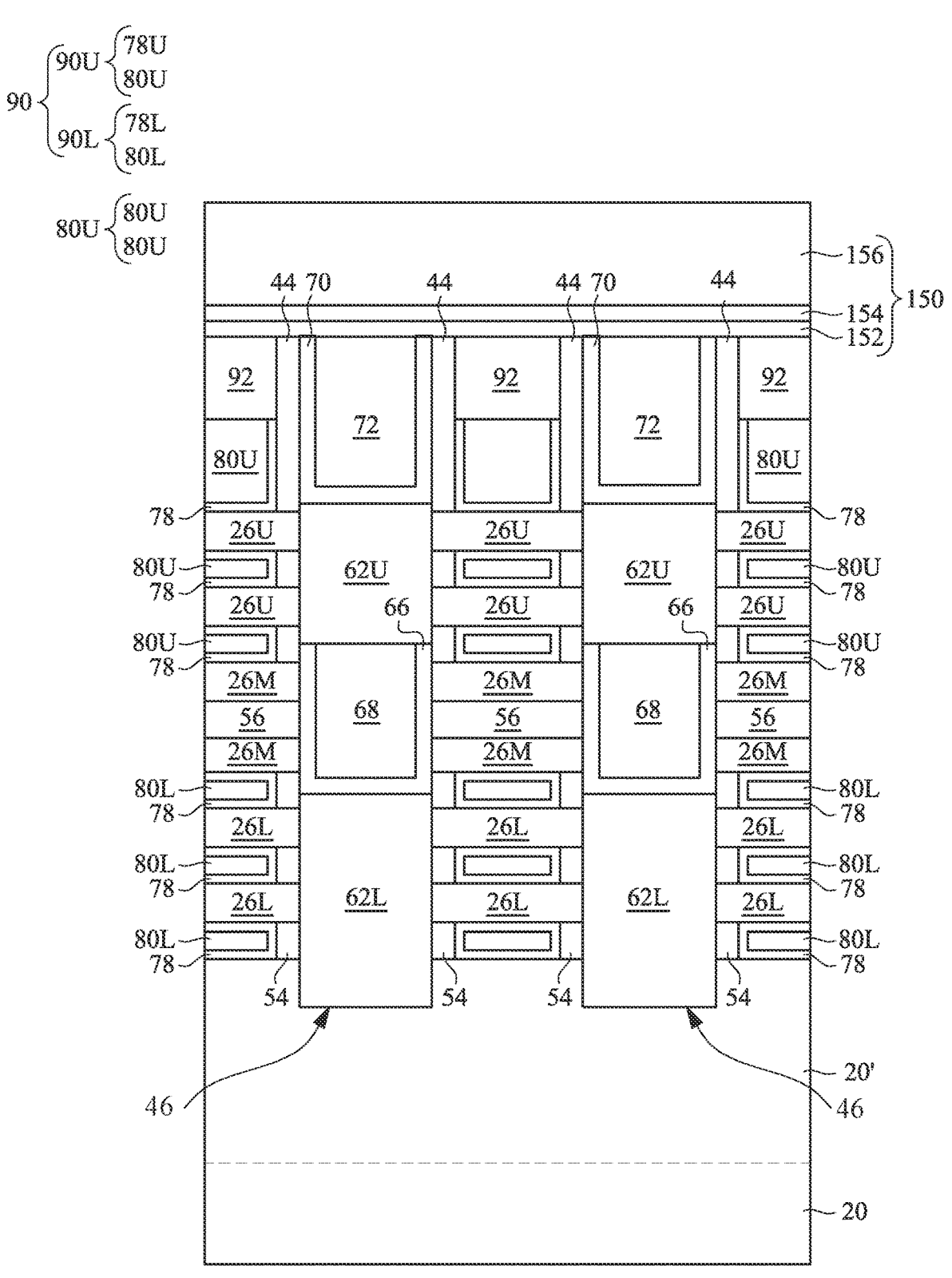

As shown in FIG. 2B, gate spacers 44 are formed over the semiconductor nanostructures 26U. In some embodiments, the gate spacers 44 may be formed on exposed sidewalls of the dummy gate stack used for patterning and forming the nanostructures 26U and 26L. The gate spacers 44 may be formed by conformally forming one or more dielectric layers and subsequently etching the dielectric layers anisotropically. The applicable dielectric materials may include silicon oxide, silicon nitride, silicon oxynitride, silicon oxycarbonitride, or the like, which may be formed by a deposition process such as CVD, ALD, or the like.

Source/drain recesses 46 are formed between the semiconductor strips 20' and the nanostructures 26 (including lower semiconductor nanostructures 26L and upper semiconductor nanostructures 26U). The source/drain recesses 46 are formed through etching, and may extend into the semiconductor strips 20'. The bottom surfaces of the source/drain recesses 46 may be at a level above, below, or level with the top surfaces of the isolation regions 32. In the etching processes, the gate spacers 44 and the dummy gate stacks used for patterning and forming the nanostructures 26L, 26M and 26U mask some portions of the patterned multi-layer stack including alternating dummy semiconductor layers and semiconductor layers. The etching may include a single etch process or multiple etch processes. Timed etch processes may be used to stop the etching of the source/drain recesses 46 upon source/drain recesses 46 reaching a desired depth.

Inner spacers 54 are formed between the nanostructures 26L or between the nanostructures 26U. Dielectric isolation layers 56 are formed between the upper semiconductor nanostructures 26U (collectively) and the lower semiconductor nanostructures 26L (collectively). The formation of inner spacers 54 and dielectric isolation layers 56 may include an etching process that laterally etches the dummy semiconductor layers between the nanostructures 26L and 26U. In the subsequent formation of source/drain regions, the inner spacers 54 may act as isolation features between the subsequently formed source/drain regions and the subsequently formed gate structures. Further, the inner spacers 54 may be used to prevent damage to the subsequently formed source/drain regions by subsequent etch processes, such as the etch processes used to form gate structures. Dielectric isolation layers 56, on the other hand, are used to isolate the upper semiconductor nanostructures 26U (collectively) from the lower semiconductor nanostructures 26L (collectively). Furthermore, middle semiconductor nanostructures 26M and dielectric isolation layers 56 may define the boundaries of the lower nanostructure-FETs and the upper nanostructure-FETs.

The inner spacers 54 and the dielectric isolation layers 56 may be formed by conformally depositing an insulating material in the source/drain recesses 46, and between the upper and lower semiconductor nanostructures 26U and 26L, and then etching the insulating material. The insulating material may be a non-low-k dielectric material, which may be a carbon-containing dielectric material such as silicon oxycarbonitride, silicon oxycarbide, silicon oxynitride, or the like. The insulating material may be formed by a deposition process, such as ALD, CVD, or the like. The etching of the insulating material may be anisotropic or isotropic. The insulating material, when etched, has portions remaining in the sidewalls of the dummy nanostructures 26A (thus forming the inner spacers 54) and has portions remaining in between the upper and lower semiconductor nanostructures 26U and 26L (thus forming the dielectric isolation layers 56).

The lower epitaxial source/drain regions 62L and upper and 62U are formed. The lower epitaxial source/drain regions 62L are formed in the lower portions of the source/drain recesses 46. The lower epitaxial source/drain regions 62L are in contact with the lower semiconductor nanostructures 26L and are not in contact with the upper semiconductor nanostructures 26U. Inner spacers 54 electrically insulate the lower epitaxial source/drain regions 62L from the dummy nanostructures 24A, which will be replaced with replacement gates in subsequent processes.

The lower epitaxial source/drain regions 62L are epitaxially grown, and have a conductivity type that is suitable for the device type (p-type or n-type) of the lower nanostructure-FETs. When lower epitaxial source/drain regions 62L are n-type source/drain regions, the respective material may include silicon or carbon-doped silicon, which is doped with an n-type dopant such as phosphorous, arsenic, or the like. When lower epitaxial source/drain regions 62L are p-type source/drain regions, the respective material may include silicon or silicon germanium, which is doped with a p-type dopant such as boron, indium, or the like.

The lower epitaxial source/drain regions 62L may be in-situ doped, and may be, or may not be, implanted with the corresponding p-type or n-type dopants. During the epitaxy of the lower epitaxial source/drain regions 62L, the upper semiconductor nanostructures 26U may be masked to prevent undesired epitaxial growth on the upper semiconductor nanostructures 26U. After the lower epitaxial source/drain regions 62L are grown, the masks on the upper semiconductor nanostructures 26U may then be removed.

A first Contact Etch Stop Layer (CESL) 66 and a first Inter-Layer Dielectric (ILD) 68 are formed over the lower epitaxial source/drain regions 62L. The first CESL 66 may be formed of a dielectric material having a high etching selectivity from the etching of the first ILD 68, such as silicon nitride, silicon oxide, silicon oxynitride, or the like, which may be formed by any suitable deposition process, such as CVD, ALD, or the like. The first ILD 68 may be formed of a dielectric material, which may be deposited by any suitable method, such as CVD, plasma-enhanced CVD (PECVD), or FCVD. The applicable dielectric material of the first ILD 68 may include phospho-silicate glass (PSG), boro-silicate glass (BSG), boron-doped phospho-silicate glass (BPSG), undoped silicate glass (USG), silicon oxide, or the like.

The formation processes may include depositing a conformal CESL layer, depositing a material for the first ILD 68, followed by a planarization process and then an etchback process. In some embodiments, the first ILD 68 is etched first, leaving the first CESL 66 unetched. An anisotropic etching process is then performed to remove the portions of the first CESL 66 higher than the recessed first ILD 68. After the recessing, the sidewalls of the upper semiconductor nanostructures 26U are exposed.

Upper epitaxial source/drain regions 62U are then formed in the upper portions of the source/drain recesses 46. The upper epitaxial source/drain regions 62U may be epitaxially grown from exposed surfaces of the upper semiconductor nanostructures 26U. The materials of upper epitaxial source/drain regions 62U may be selected from the same candidate group of materials for forming lower source/drain regions 62L, depending on the desired conductivity type of upper epitaxial source/drain regions 62U.

The conductivity type of the upper epitaxial source/drain regions 62U may be opposite the conductivity type of the lower epitaxial source/drain regions 62L. For example, the upper epitaxial source/drain regions 62U may be oppositely doped from the lower epitaxial source/drain regions 62L. The upper epitaxial source/drain regions 62U may be in-situ doped, and/or may be implanted, with an n-type or p-type dopant. Adjacent upper source/drain regions 62U may remain separated after the epitaxy process or may be merged.

After the epitaxial source/drain regions 62U are formed, a second CESL 70 and a second ILD 72 are formed. The materials and the formation methods may be similar to the materials and the formation methods of first CESL 66 and first ILD 68, respectively, and are not discussed in detail herein. The formation process may include depositing the layers for CESL 70 and ILD 72, and performing a planarization process to remove the excess portion of the corresponding layers. After the planarization process, top surfaces of the second ILD 72 and the gate spacers 44 are coplanar (within process variations).

Gate dielectrics 78 are formed as parts of a conformal liner in recesses, and are formed on the exposed semiconductor nanostructures 26. The gate dielectrics 78 are formed on the exposed surfaces of the exposed features including the semiconductor nanostructures 26 and the gate spacers 44. The gate dielectrics 78 wrap around all (e.g., four) sides of the semiconductor nanostructures 26.

The gate dielectrics 78 (including 78U and 78L) are formed to encircle nanostructures 26U, 26M, and 26L. Each of the gate dielectrics 78 may include an interfacial layer, which may be formed of or comprise a group IV element, a group III element, and/or a group V element, and a high-k dielectric layers, which have a high dielectric constant (high-k) value. Each of the gate dielectrics 78 may include an interfacial layer, which may be formed of or comprise a group IV element, a group III element, and/or a group V element. Interfacial layer may include an oxide such as silicon oxide or a metal oxide, a silicate such as a metal silicate, combinations thereof, multi-layers thereof, or the like. The interfacial layer may be formed of a thermal oxidation process and/or a deposition process. The formation methods of high-k dielectric layers may include deposition process. For clarification, the gate dielectrics 78 are denoted as 78U and 78L.

The gate dielectrics 78 and the respective gate electrodes 80 are collectively referred to as gate stacks 90, which include upper gate stack 90U and lower gate stack 90L. The resulting upper FET 10U and lower FET 10L share a common gate electrode 80. The upper portion of the gate electrode 80 that is higher than dielectric isolation layer 56 is referred to as upper gate electrode 80U. The lower portion of the gate electrode that is lower than dielectric isolation layer 56 is referred to as lower gate electrode 80L.

The gate masks 92 are formed over the upper gate stack 90U. The formation process may include recessing gate stacks 90, filling the resulting recesses with a dielectric material such as silicon nitride, silicon carbonitride, silicon oxynitride, silicon oxycarbonitride, or the like, and performing a planarization process to remove the excess portions of the dielectric material over the second ILD 72.

As shown in FIGS. 2A through 2E, a hard mask layer 150 is formed and covers the gate masks 92 and the source/drain regions 62 (illustrated as dash-lines). The hard mask layer 150 includes a bottom mask layer 152, a protective layer 156 and a polish stop layer 154 directly between the bottom mask layer 152 and the protective layer 156. The bottom mask layer 152, the polish stop layer 154 and the protective layer 156 forms a sandwich-like hard mask layer 150. In some embodiments, the protective layer 156 may be interchangeably referred as a top mask layer over the polish stop layer 154.

In one or more embodiments of the present disclosure, the material of the polish stop layer 154 is different from the material of the protective layer 156, so that a polish stop layer 154 has a polish rate different from a polish rate of the protective layer. For example, the polish stop layer 154 may include amorphous semiconductor material such as amorphous silicon, and the protective layer 156 may include silicon nitride. In the embodiment that the polish stop layer 154 is amorphous semiconductor material, the material of the bottom mask layer 152 and the protective layer 156 may be oxygen-free material in order to prevent the polish stop layer 154 from oxidizing. In some embodiments, the material of the bottom mask layer 152 and the protective layer 156 may include silicon nitride, which is free from oxygen. In some embodiments, the bottom mask layer 152, the polish stop layer 154 and the protective layer 156 may be formed by deposition process.

Figure 2C:
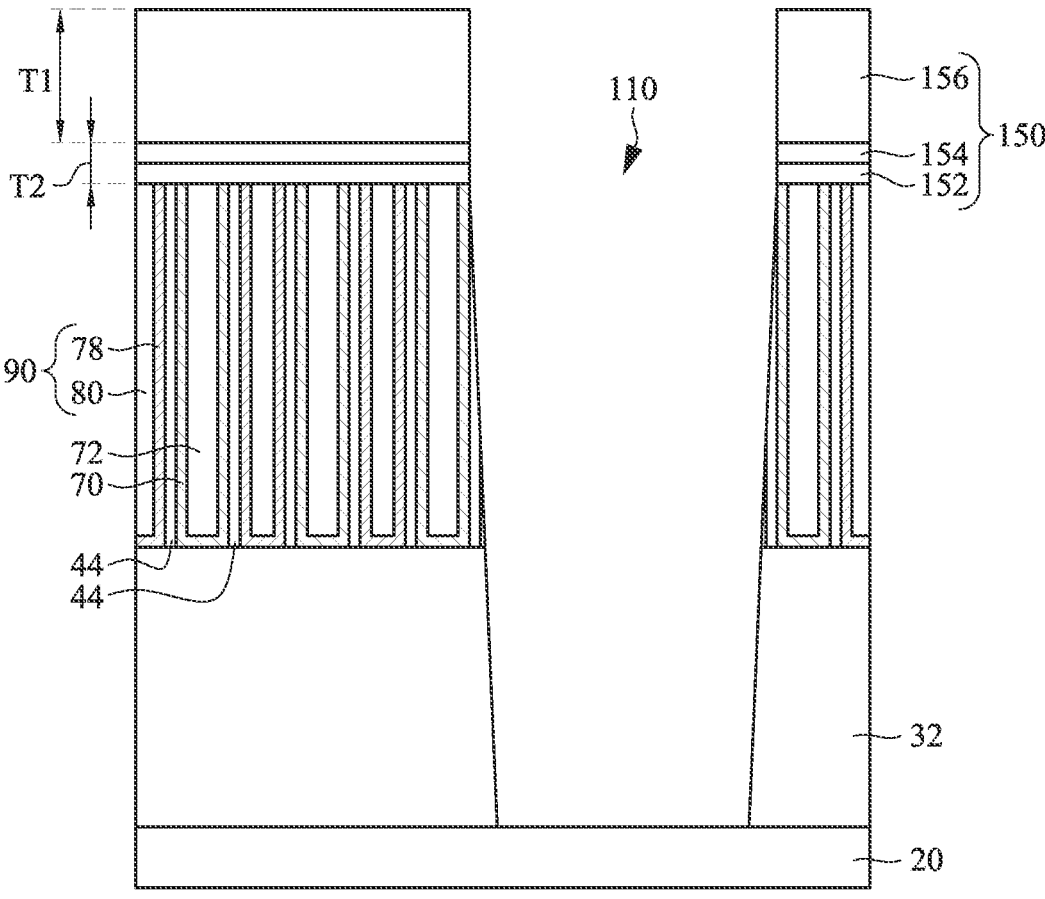
Figure 2D:
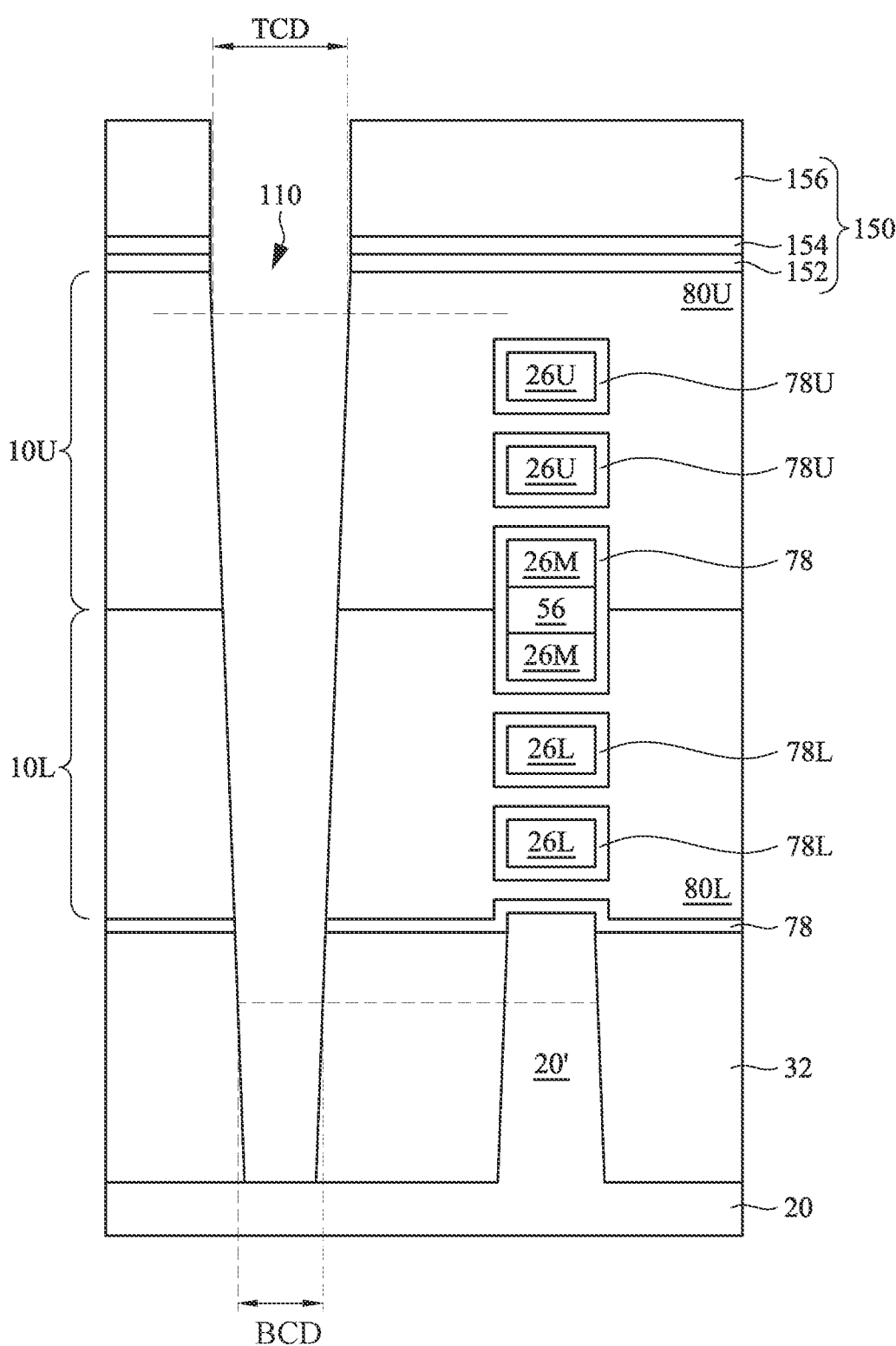

As shown in FIG. 2C, a thickness T1 of the protective layer 156 is greater than a total thickness T2 of the combination of the polish stop layer 154 and the bottom mask layer 156 in the vertical direction. The bottom mask layer 152 may be very thin such that the removal of the bottom mask layer 152 in a subsequent polish process can be easily controlled since a process time of the bottom mask layer 152 in the subsequent polish process may be short and polishing to the bottom mask layer 152 may easily stop.

Figure 2E:
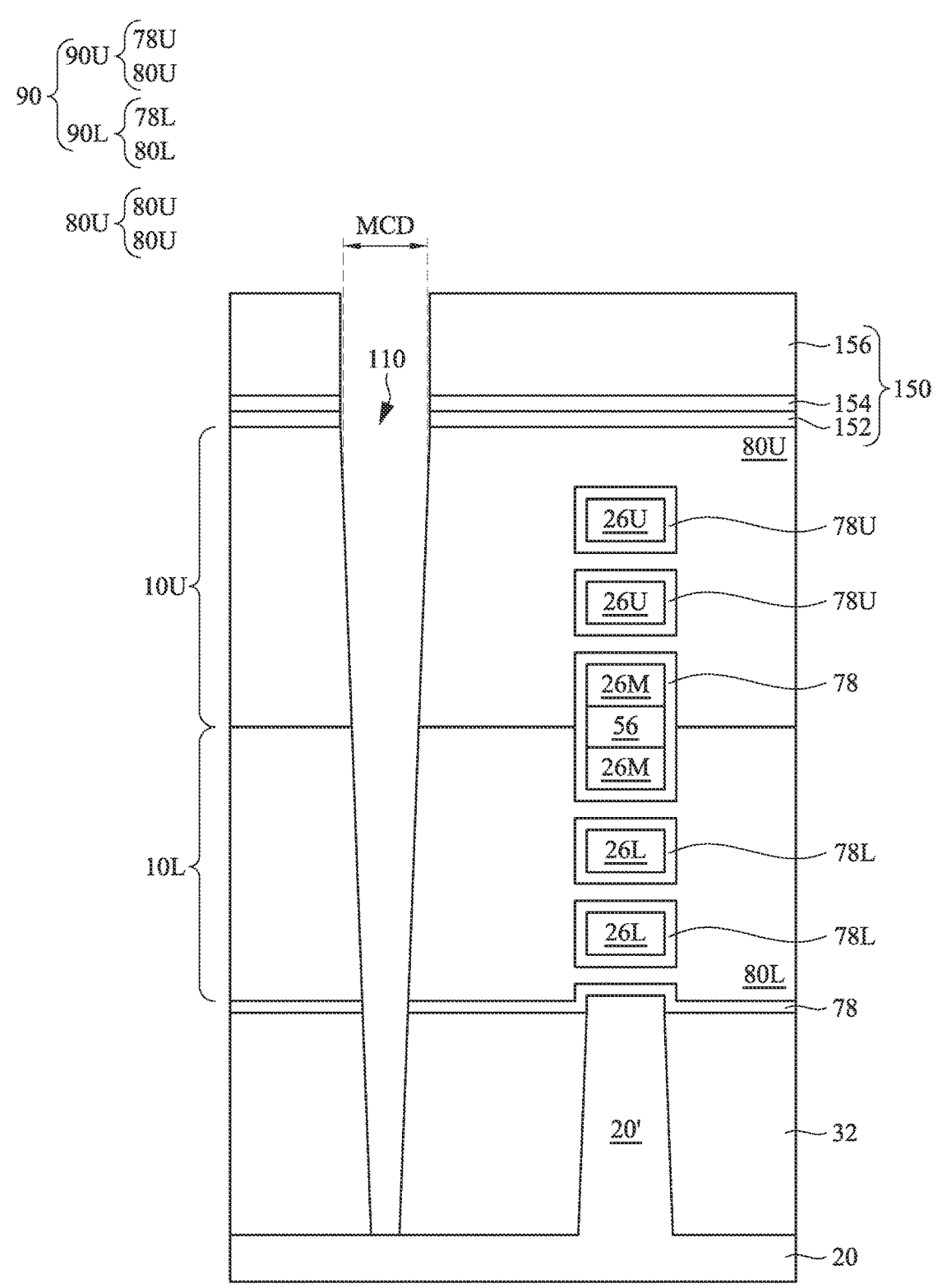

The hard mask layer 150 is patterned. The patterning process to the hard mask layer 150 may include one or more photolithography processes, including double-patterning or multi-patterning processes. The trench 110 is than formed based on the patterned hard mask layer 150 and across the plurality of the gate stacks 90. In FIG. 2C, the trench 110 extends through the gate stacks 90 to the top surface of the substrate 20, and some of the gate stacks 90, the gate spacers 44, the CESL 70 and ILD 72 are removed. In FIGS. 2D and 2E, the trench 110 extends through the gate electrodes 80U and 80L, the dielectric layer 78 over the semiconductor strip 20' and the isolation regions 32.

As illustrated in FIG. 2A, the trench 110 has a large target critical dimension along the cross-sectional view of FIG. 2D and a small target critical dimension along the cross-sectional view of FIG. 2E. The trench 110 having the large target critical dimension in FIG. 2D may defines a top critical dimension TCD at a height higher than the topmost upper semiconductor nanostructures 26U and a bottom critical dimension BCD at a height lower than the bottom-most lower semiconductor nanostructures 26L. In some embodiments, the top CD TCD may be in a range between 30 nm and 50 nm. In some embodiments, the bottom CD BCD may be in a range between 20 nm and 30 nm. In FIG. 2E, a middle CD MCD may be defined in a cross-sectional view of the trench 110 having the small target critical dimension. In some embodiments, the middle CD MCD may be in a range between 20 nm and 30 nm.

Figure 3A:
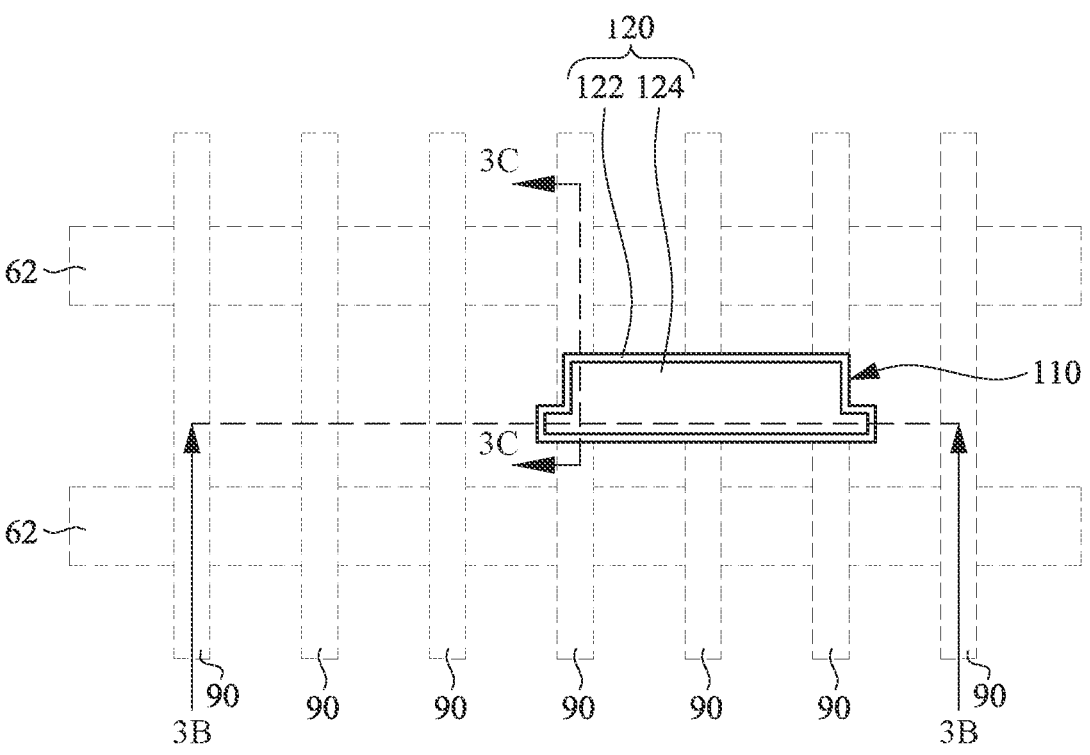
Figure 3B:
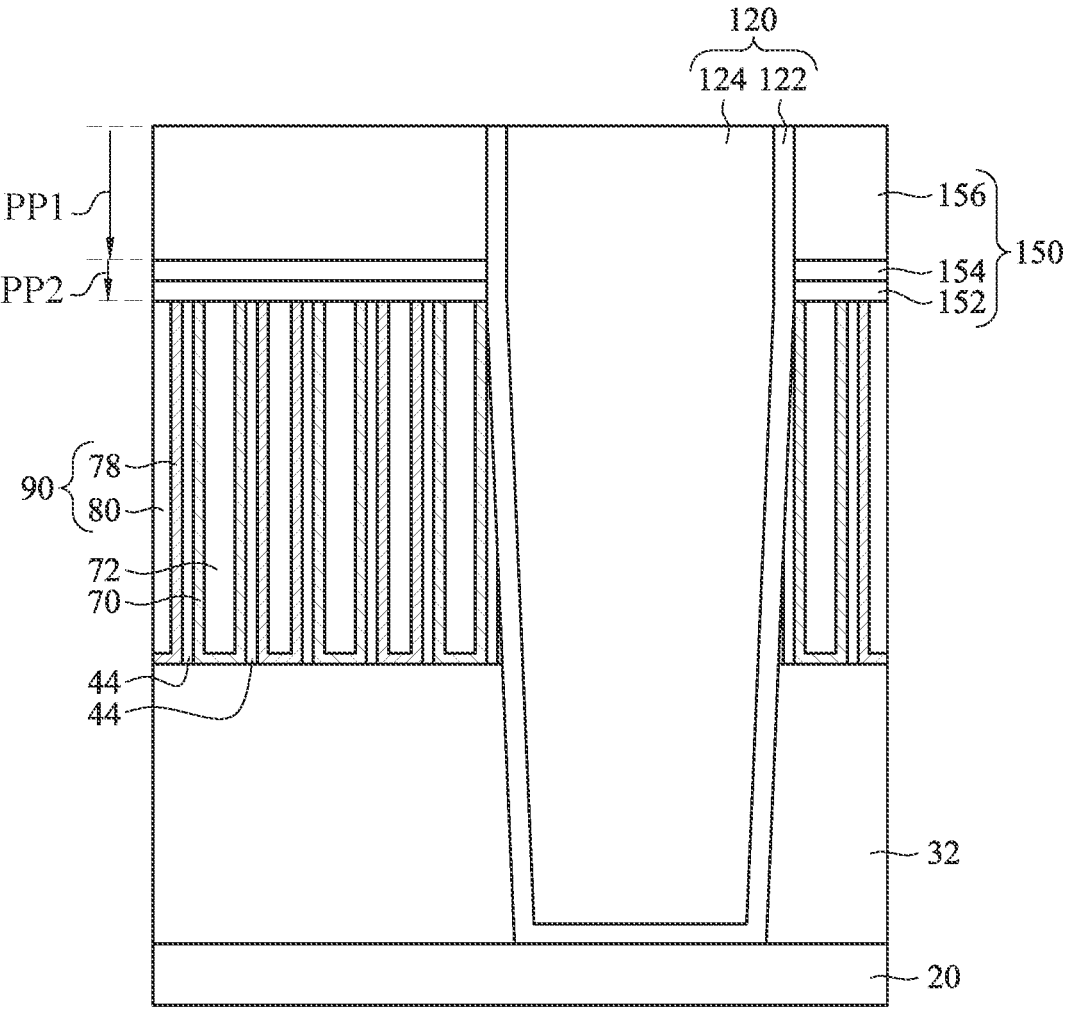
Figure 3C:
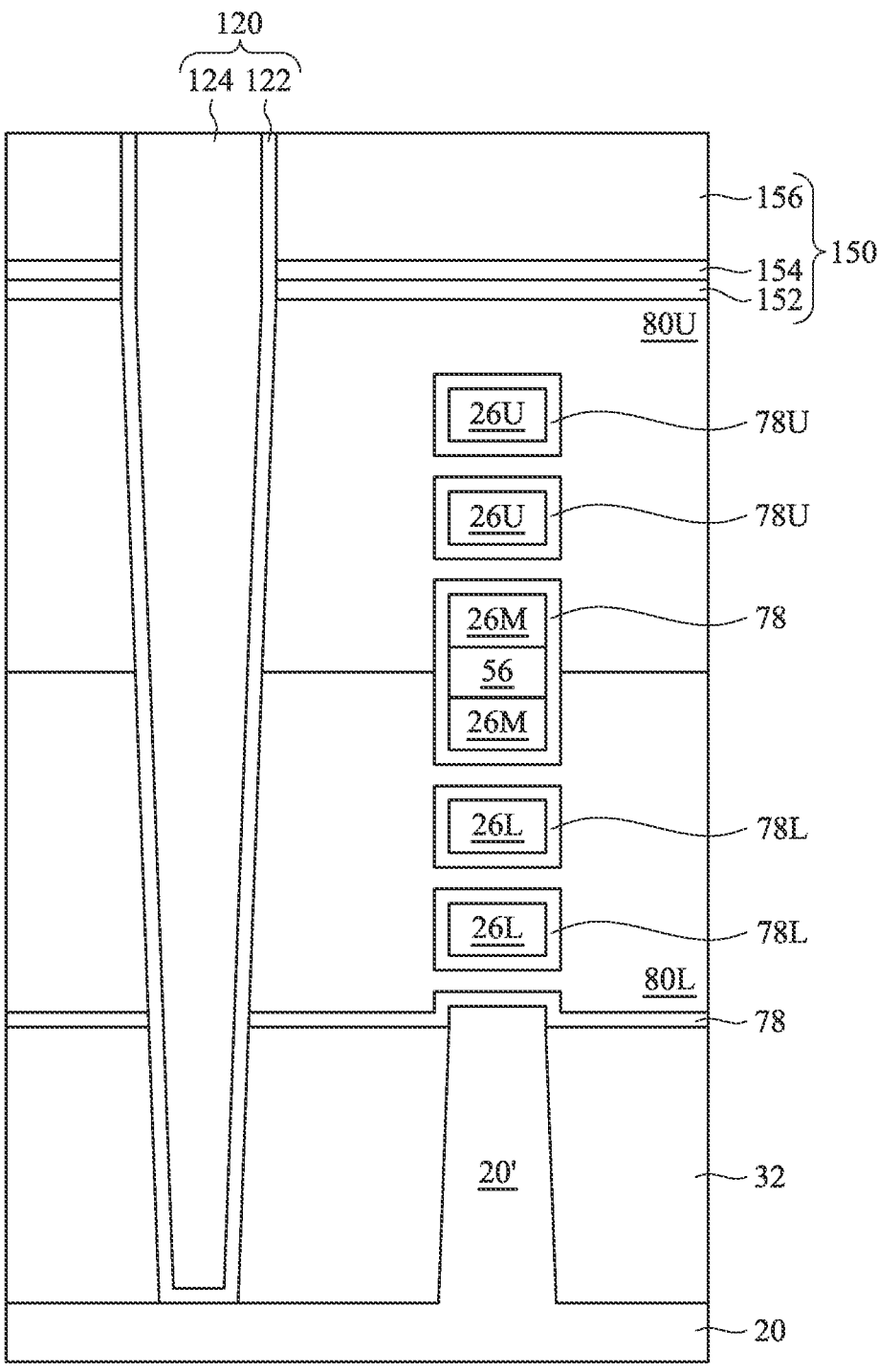

FIGS. 3A through 3C illustrate the top view and cross-sectional views of an intermediate stage in the formation of CFETs in accordance with some embodiments, wherein FIGS. 3A through 3C illustrate forming a vertical local interconnect (VLI) structure 120 in the trench 110.

The VLI structure 120 is formed to provide a vertical connection between the upper source/drain epitaxial regions 62U of the upper FET 10U and the upper source/drain epitaxial regions 62L of the lower FET 10L in the same column. The function of the VLI structure 120 is to reduce the parasitic resistance and capacitance that can occur when the source and drain regions are connected horizontally using metal lines. The VLI structure 120 provides a shorter and more direct path for the current to flow, which reduces the resistance and improves the performance of the device. In addition to reducing parasitic resistance and capacitance, the VLI structure 120 also provides a more compact and efficient design. By connecting the source/drain epitaxial regions 612 vertically, the device can be made smaller, which reduces the overall size and cost of the circuit. In some embodiments, the VLI structure 120 can be interchangeably referred to as metal-like defined (MD) local interconnect (MDLI).

As illustrated in FIGS. 3A through 3C, a dielectric liner 122 is formed to line sidewalls and bottom of the trench 110 and extends through the patterned hard mask layer 150. The dielectric liner 122 may laterally cover and seal the polish stop layer 154 between the bottom mask layer 152 and the protective layer 156. In some embodiments, the dielectric liner 122 may be an oxygen-free liner so as to prevent the polish stop layer 154 from oxidizing. In some embodiments, the dielectric liner 122 may include silicon nitride formed by a deposition process. Subsequently, a conductive material is formed in a remainder of the trench 110 and over the dielectric liner 122. The conductive material may include a low resistivity conductor material, for example, having metal resistivity less than 48 μΩ·cm.

Figure 4A:
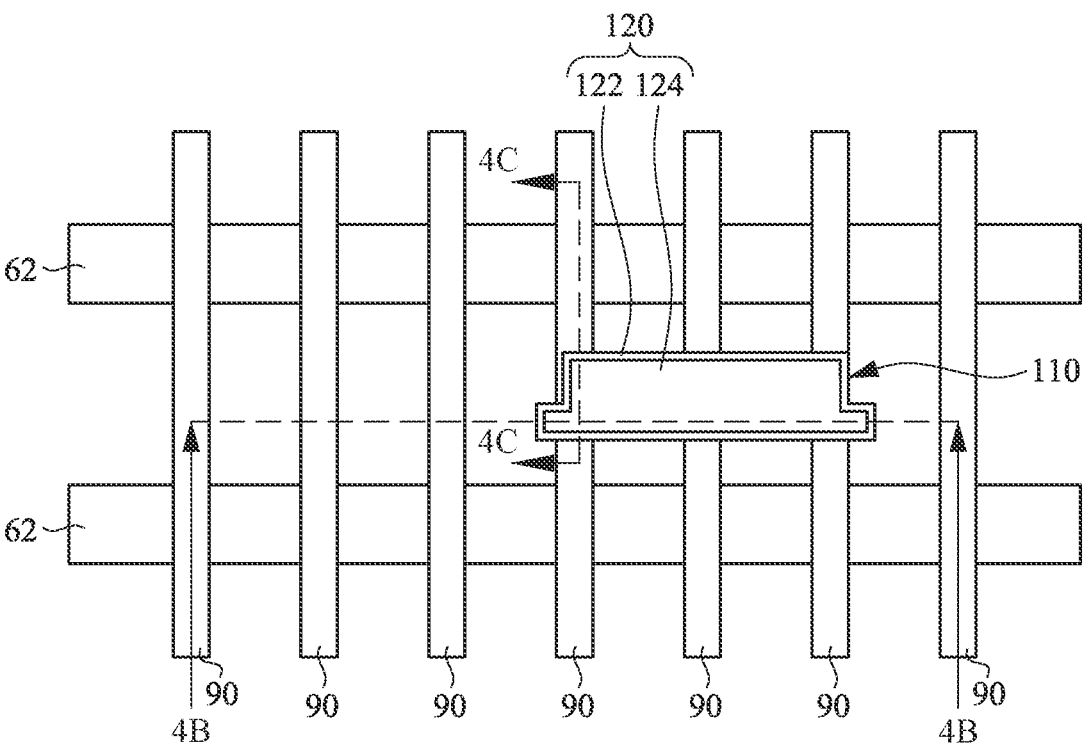
Figure 4B:
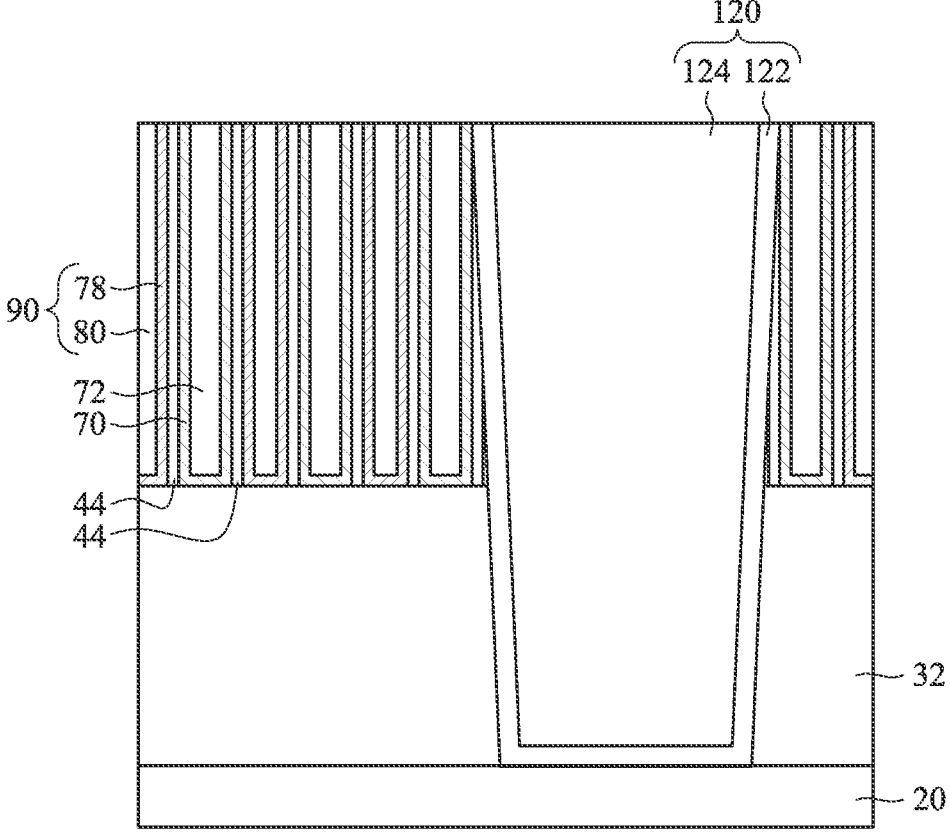
Figure 4C:
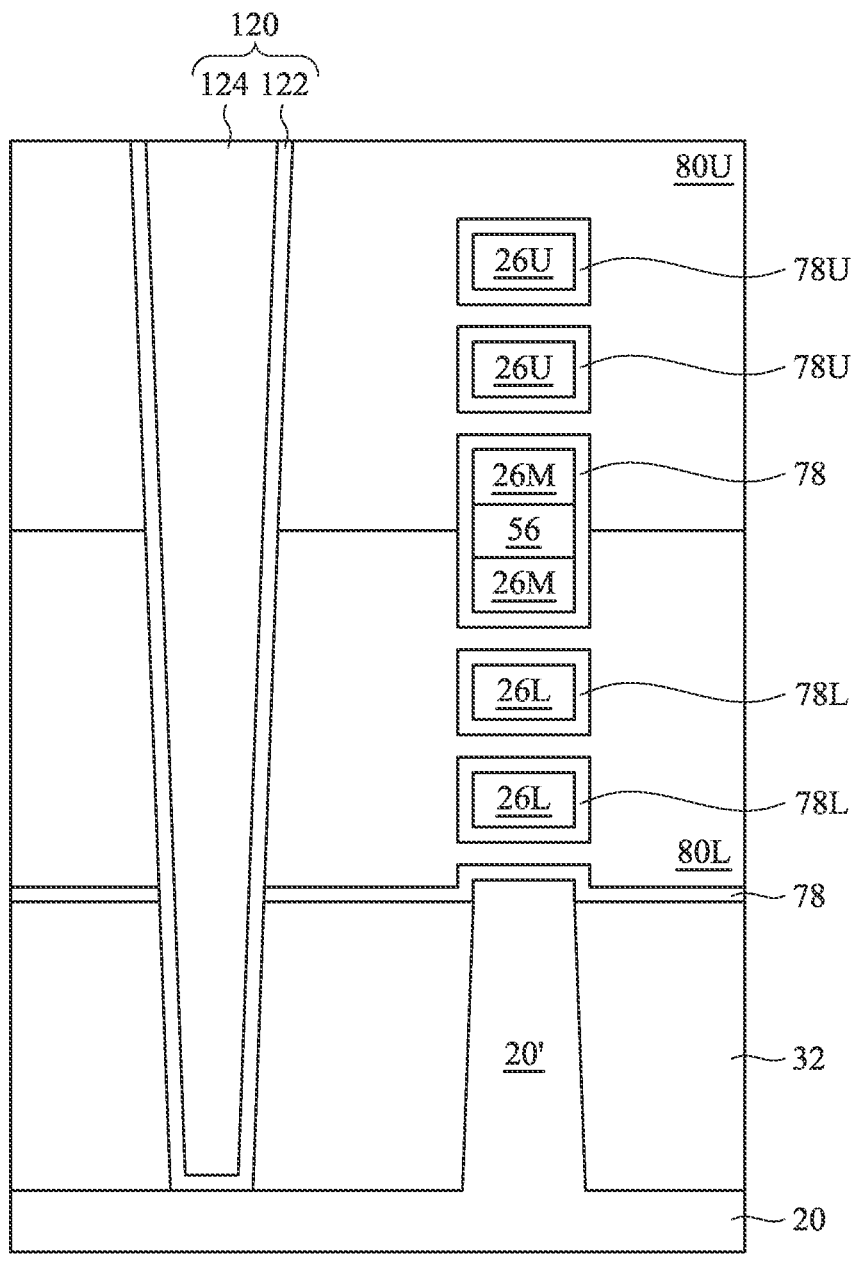

After the conductive material 124 are formed, polish processes PP1 and PP2 may be performed to the hard mask layer 150, the dielectric liner 122 and the conductive material 124, wherein the arrows of the polish processes PP1 and PP2 as illustrated in FIG. 3B present polish regions of the polish processes PP1 and PP2, respectively. The polish process PP1 stop at a level of the polish stop layer 154 and the polish process PP2 may start from the polish stop layer 154 and controllably stop at a top surface of the ILD layer 72, as illustrated in FIG. 3B for clarification. The polish stop layer 154 may be sealed by the bottom mask layer 152, the protective layer 156 and the dielectric liner 122 until the protective layer 156 are removed by the polish process PP1. FIGS. 4A through 4C illustrate the top view and cross-sectional views of an intermediate stage in the formation of CFETs in accordance with some embodiments, wherein FIGS. 4A through 4C illustrates the hard mask layer 150, the dielectric liner 122 and the conductive material 124 are polished by two-step polish process including the polish processes PP1 and PP2. The VLI structure 120 includes the dielectric liner 122 and the conductive material 124 having top surfaces level with the ILD layer 72.

Figure 5A:
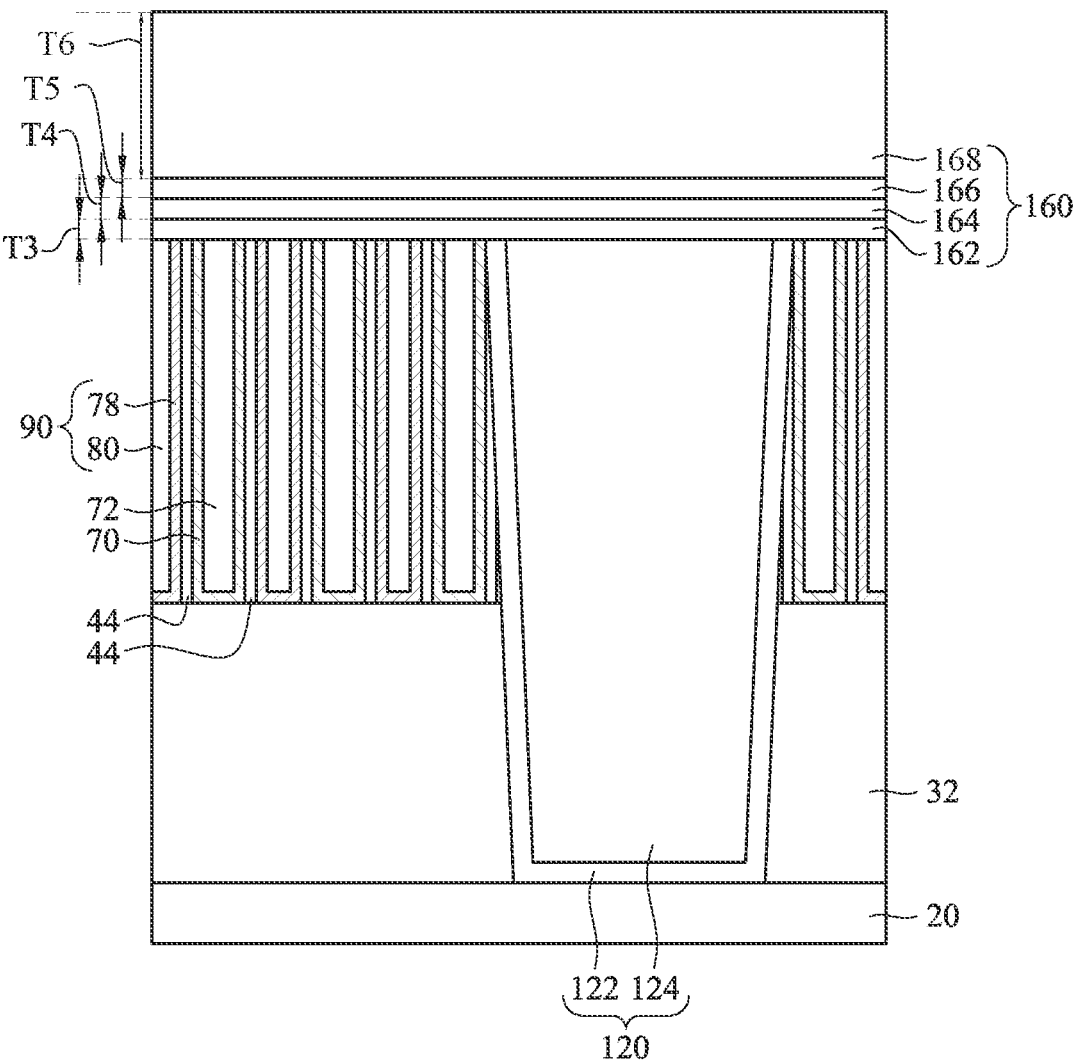
Figure 5B:
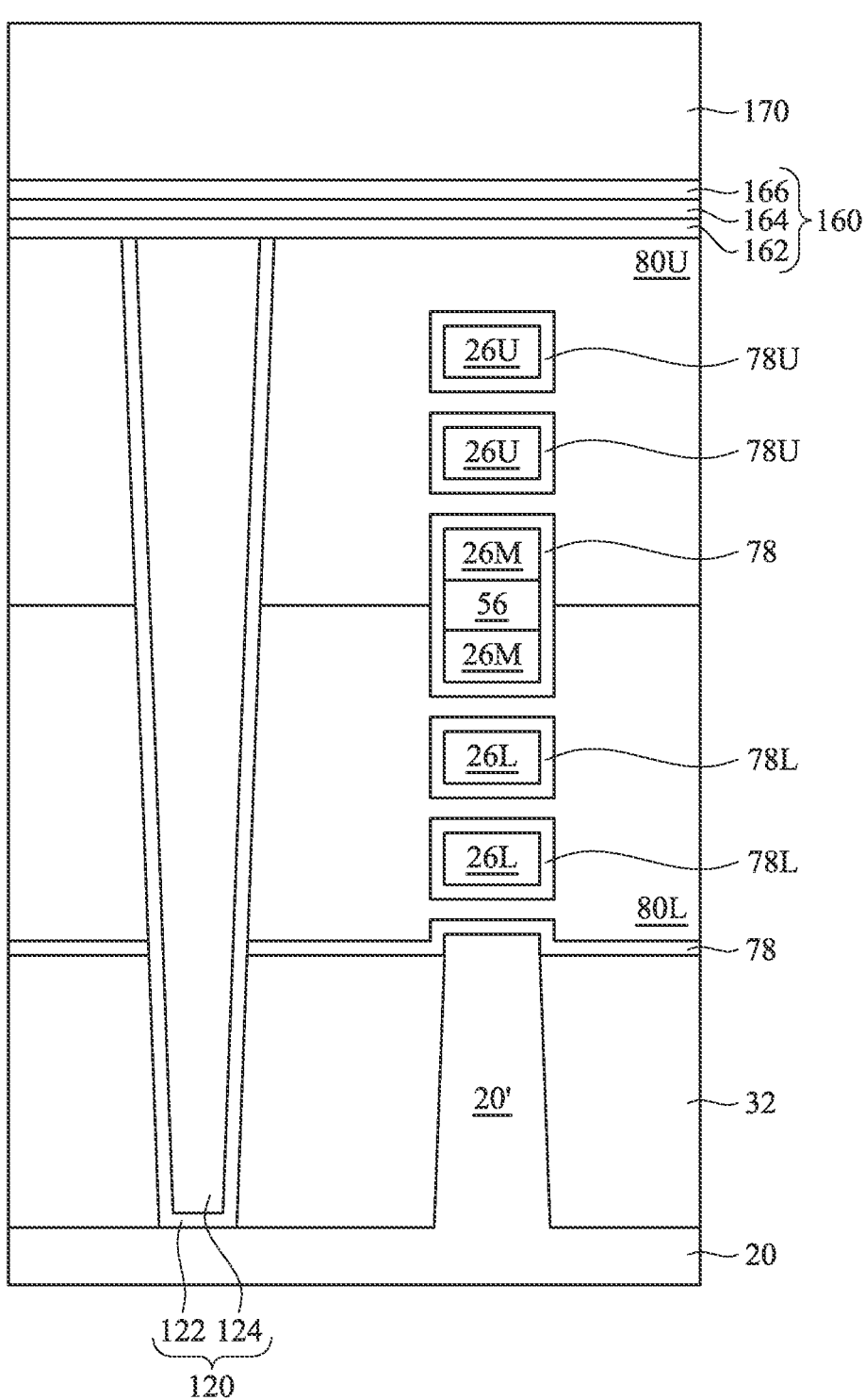

FIGS. 5A and 5B illustrate the cross-sectional views of an intermediate stage in the formation of CFETs in accordance with some embodiments, wherein FIGS. 5A and 5B illustrate forming a hard mask layer 160 over the structure as illustrated in FIGS. 4B and 4C. FIG. 5A illustrates a vertical cross-section that is perpendicular to the longitudinal axis of the gate stacks 90 and across the plurality of the gate stacks 90. FIG. 5B illustrates a vertical cross-section that is along a longitudinal axis of a gate electrode 80 of the CFET.

As illustrated in FIGS. 5A and 5B, the hard mask layer 160 includes a bottom mask layer 162, a protective layer 166 and a polish stop layer 164 directly between the bottom mask layer 162 and the protective layer 166. The bottom mask layer 162, the polish stop layer 164 and the protective layer 166 forms a sandwich-like hard mask layer 160. In some embodiments, the protective layer 166 may be interchangeably referred to as a top mask layer over the polish stop layer 164.

In one or more embodiments of the present disclosure, the material of the polish stop layer 164 is different from the material of the protective layer 166, so that a polish stop layer 164 has a polish rate different from a polish rate of the protective layer. For example, the polish stop layer 164 may include amorphous semiconductor material such as amorphous silicon, and the protective layer 166 may include silicon nitride. In the embodiment that the polish stop layer 164 is amorphous semiconductor material, the material of the bottom mask layer 162 and the protective layer 166 may be oxygen-free material in order to prevent the polish stop layer 164 from oxidizing. In some embodiments, the material of the bottom mask layer 162 and the protective layer 166 may include silicon nitride, which is free from oxygen. In some embodiments, the bottom mask layer 162, the polish stop layer 164 and the protective layer 166 may be formed by deposition process.

In FIGS. 5A and 5B, the hard mask layer 160 includes an oxide layer 168 over the protective layer 166. The oxide layer 168 may include oxide material such as silicon oxide. In some embodiments, the oxide layer 168 may be formed by a deposition of silicon material layer over the protective layer 166 and oxidizing the silicon material layer. During and after the oxide layer 168 is formed, the protective layer 166 always covers the polish stop layer 164 to isolate the polish stop layer 164 from the oxide layer 168, and it prevent the polish stop layer 164 from oxidizing as the oxide layer 168 is formed.

As illustrated in FIG. 5A, in the vertical direction, the bottom mask layer 162 has a thickness T3, the polish stop layer 164 has a thickness T4, the protective layer 166 has a thickness T5 and the oxide layer 168 has a thickness T6, and the thickness T6 of the oxide layer 168 is greater than any of the thickness T3, T4 and T5. The bottom mask layer 162 may have a very thin thickness T3 such that the removal of the bottom mask layer 162 in a subsequent polish process can be easily controlled since a process time of the bottom mask layer 162 in the subsequent polish process may be short and polishing to the bottom mask layer 162 may easily stop. In some embodiments, the bottom mask layer 162 may have the thickness T3 less than 5 nm. The polish stop layer 164 may have the thickness T4 in a range between 5 nm and 10 nm. The protective layer 166 may have the thickness T5 less than 5 nm. The oxide layer 168 may have the thickness T6 in a range between 30 nm and 60 nm.

Figure 6A:
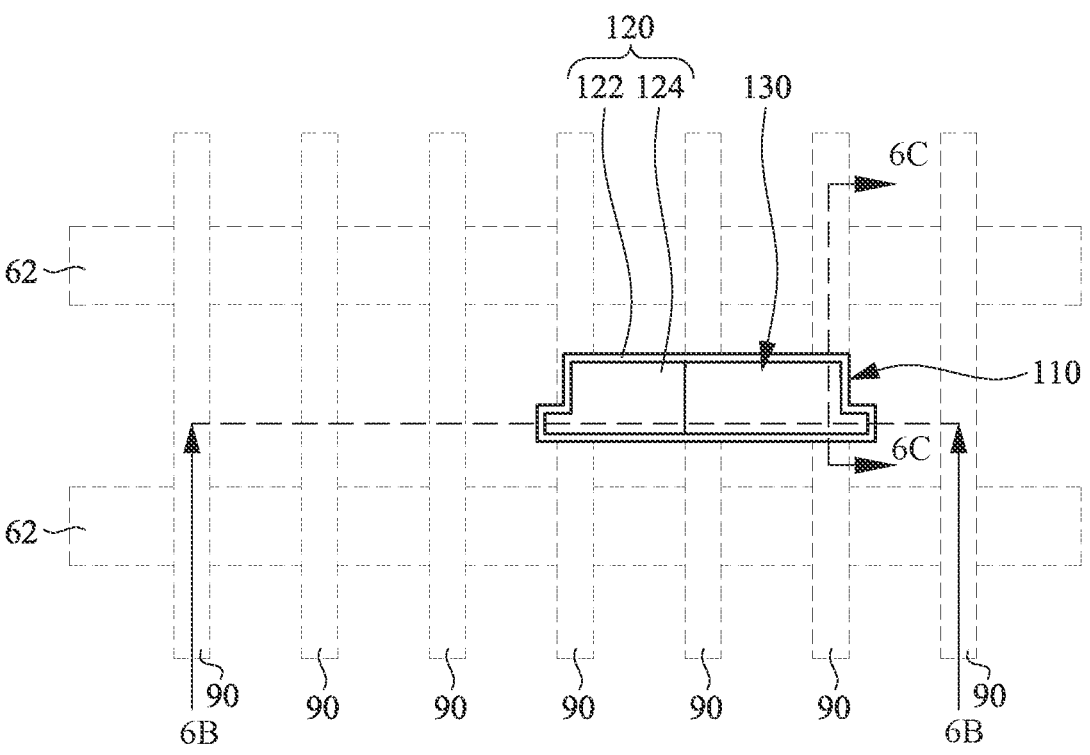
Figure 6B:
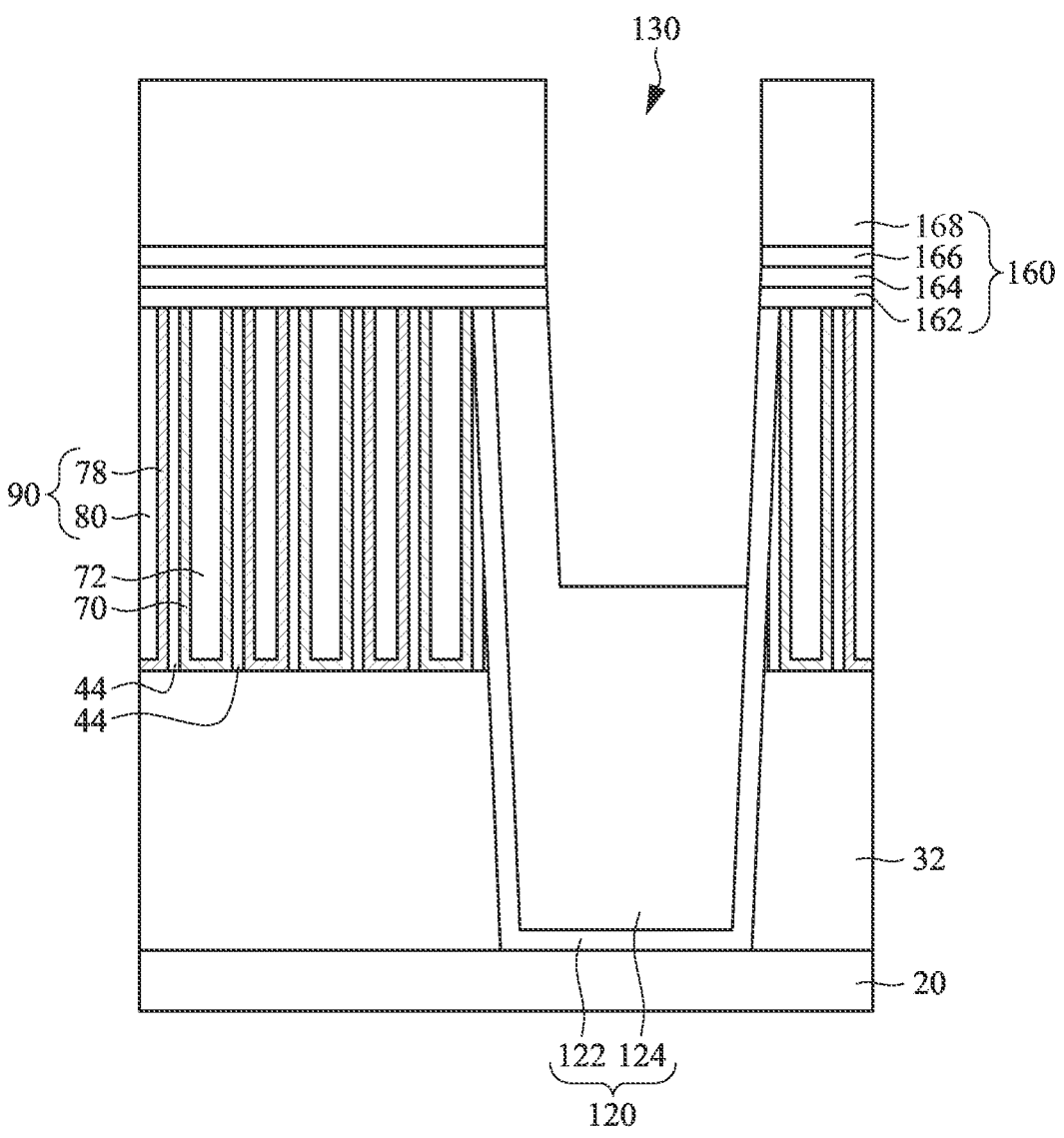
Figure 6C:
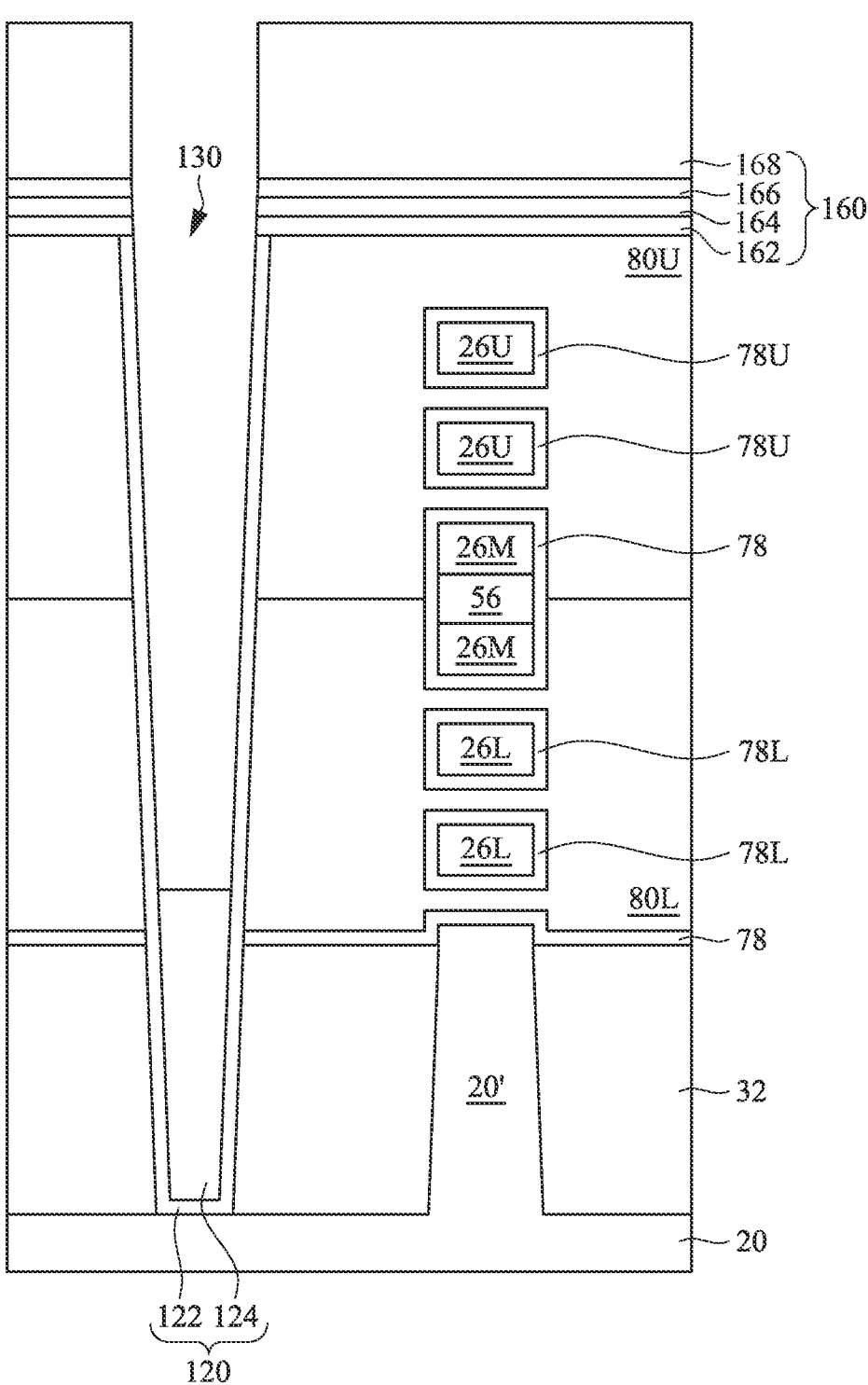

FIGS. 6A through 6C illustrate the top view and cross-sectional views of an intermediate stage in the formation of CFETs in accordance with some embodiments, wherein FIGS. 6A through 6C illustrate patterning the hard mask layer 160 and forming a trench 130 in the VLI structure 120. The trench 130 extends across the gate stack 90 and is interposed between the adjacent source/drain epitaxial structures 62 from the top view of FIG. 6A.

As illustrated in FIGS. 6A through 6C, the hard mask layer 160 is patterned. The patterning process to the hard mask layer 160 may include one or more photolithography processes, including double-patterning or multi-patterning processes. The trench 130 is than formed based on the patterned hard mask layer 160 and recessed from the conductive material 124 of the VLI structure 120, such that the VLI structure 120 can be a L-shaped structure (see FIG. 6B) and connect the source and drain regions of the t upper FET 10U and lower FET 10L in the column.

The VLI structure 120 having L-shaped can reduce the resistance and capacitance of the interconnect, which can improve the performance of the transistor. The L-shape design of the VLI structure 120 allows for a shorter distance between the gate and source/drain regions, which reduces the overall resistance of the interconnect, which in turn improves the speed, power efficiency, and overall performance of electronic devices.

Figure 7A:
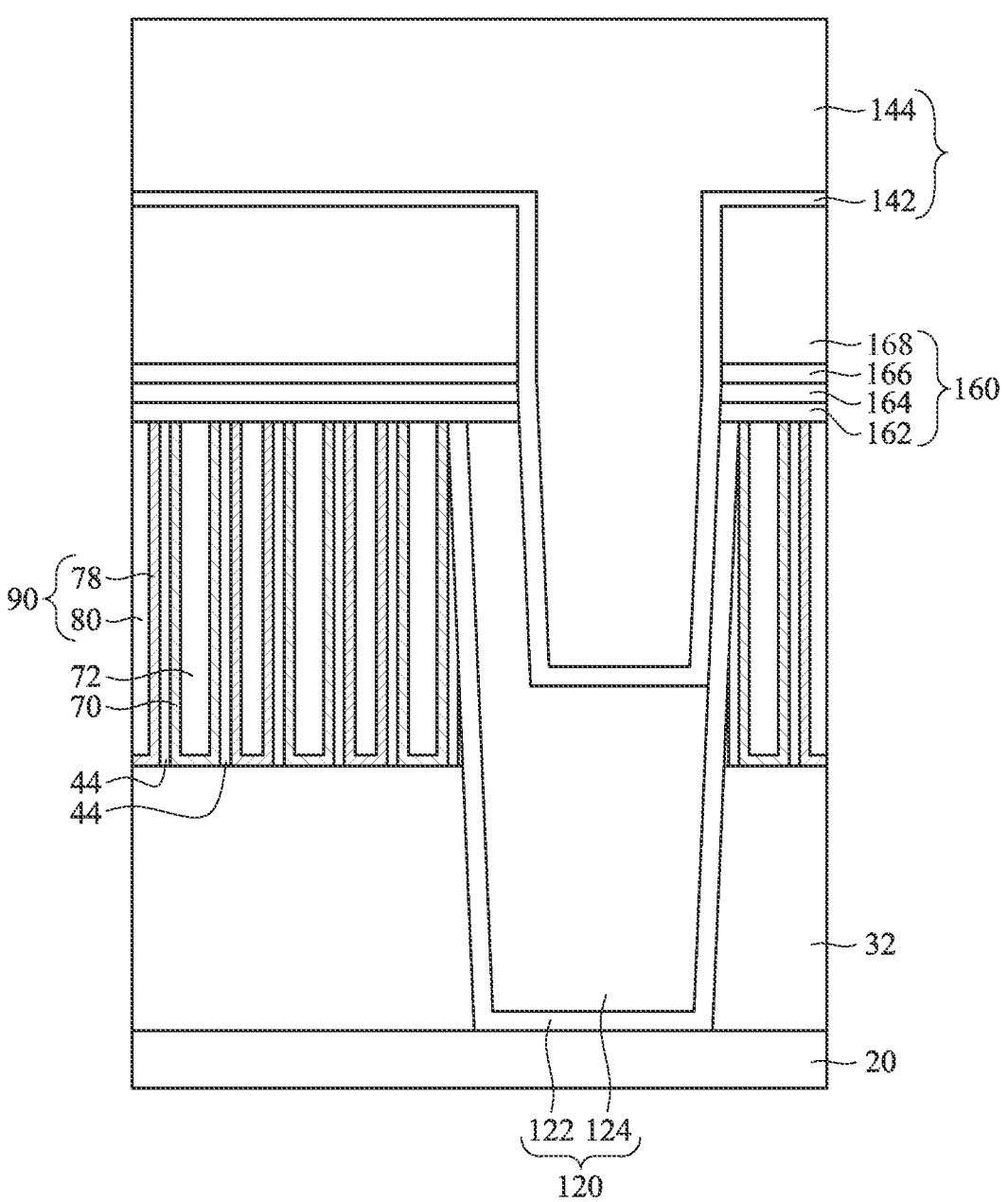
Figure 7B:
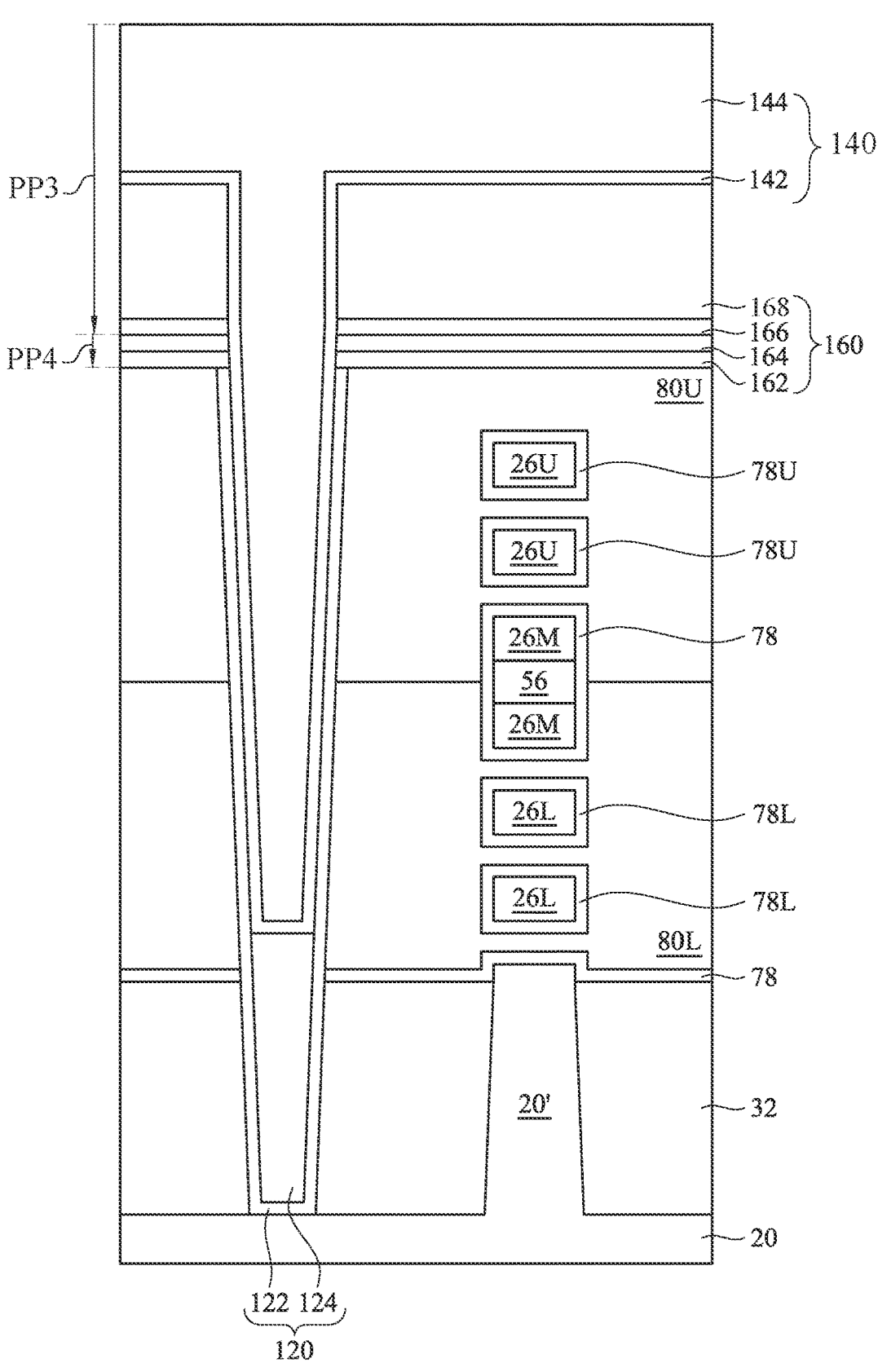

FIGS. 7A and 7B illustrate the top view and cross-sectional views of an intermediate stage in the formation of CFETs in accordance with some embodiments, wherein FIGS. 7A and 7B illustrate forming an isolation structure 140 including a dielectric liner 142 and a dielectric material in the trench 130 recessed from the VIL structure 120.

As shown in FIGS. 7A and 7B, a dielectric liner 142 is formed to line sidewalls and bottom of the trench 130. In FIGS. 7A and 7B, the dielectric liner 142 is formed to sidewalls of the dielectric liner 132. The dielectric liner 142 extends from a top surface of the oxide layer 168 into the trench 130.

As illustrated in FIGS. 7A and 7B, the dielectric liner 142 seals the polish stop layer 164 between the bottom mask layer 162 and the protective layer 166. In some embodiments, the polish stop layer 164 includes amorphous semiconductive material such as amorphous silicon, and the dielectric liner 142 may include oxygen-free material such as silicon nitride layer to prevent the polish stop layer 164 from oxidizing during and after the dielectric liner 142 is formed. Subsequently, a dielectric material 144 is formed over the dielectric liner 142 to fill in the trench. In some embodiments, the dielectric material 144 may include oxide material such as silicon oxide formed by deposition and oxidation process and the polish stop layer 164 is spaced apart from the dielectric material 144 by the dielectric liner 142 during the dielectric material 144 is formed.

Figure 8A:
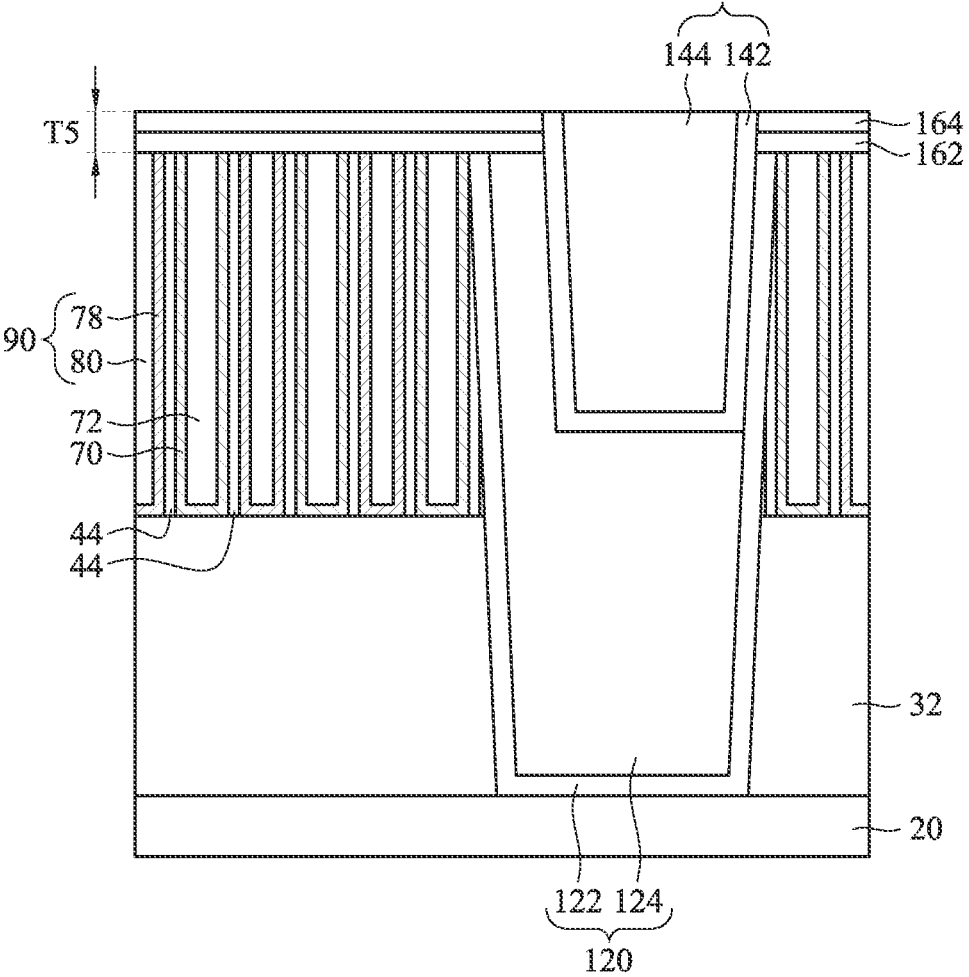
Figure 8B:
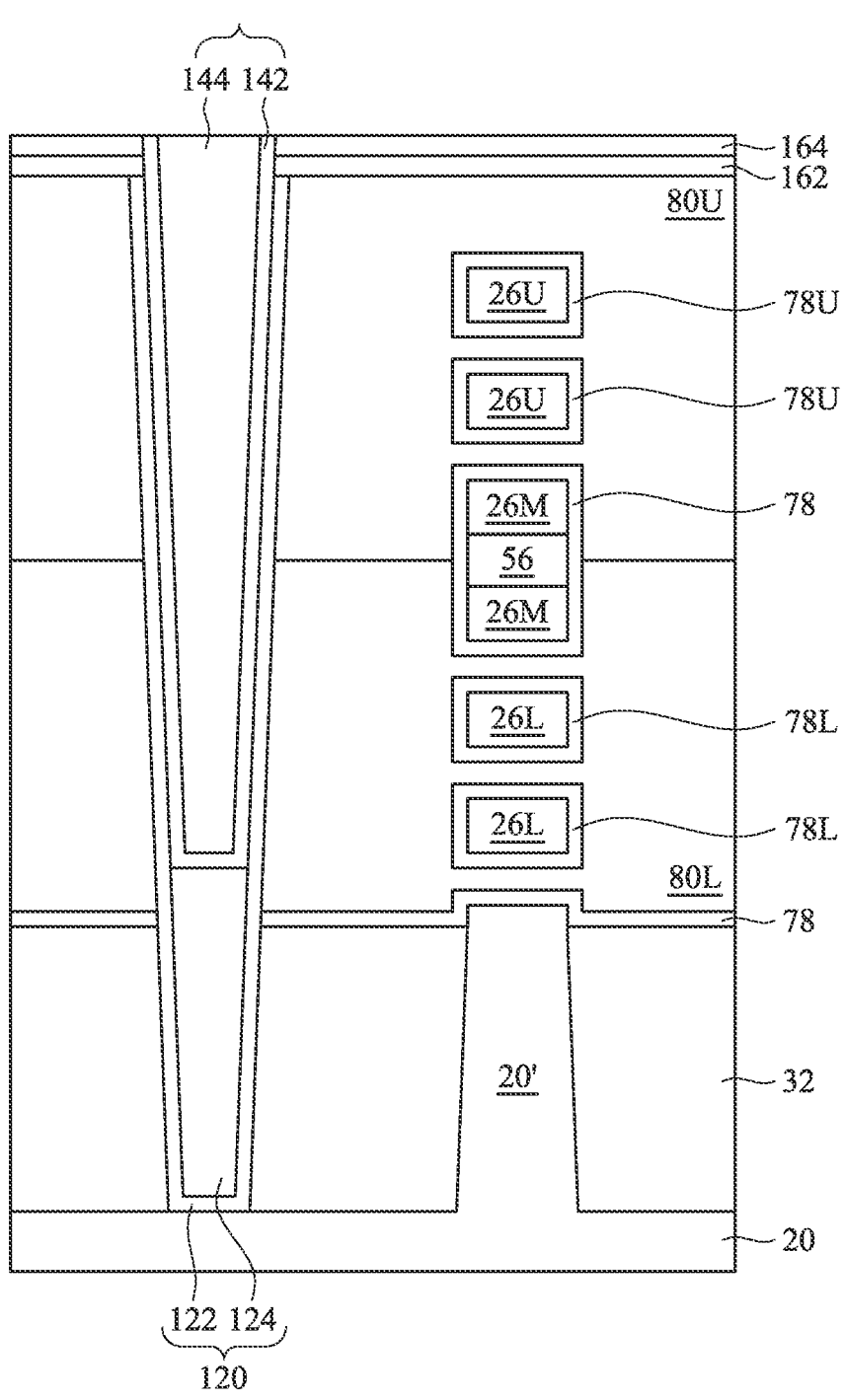
Figure 9A:
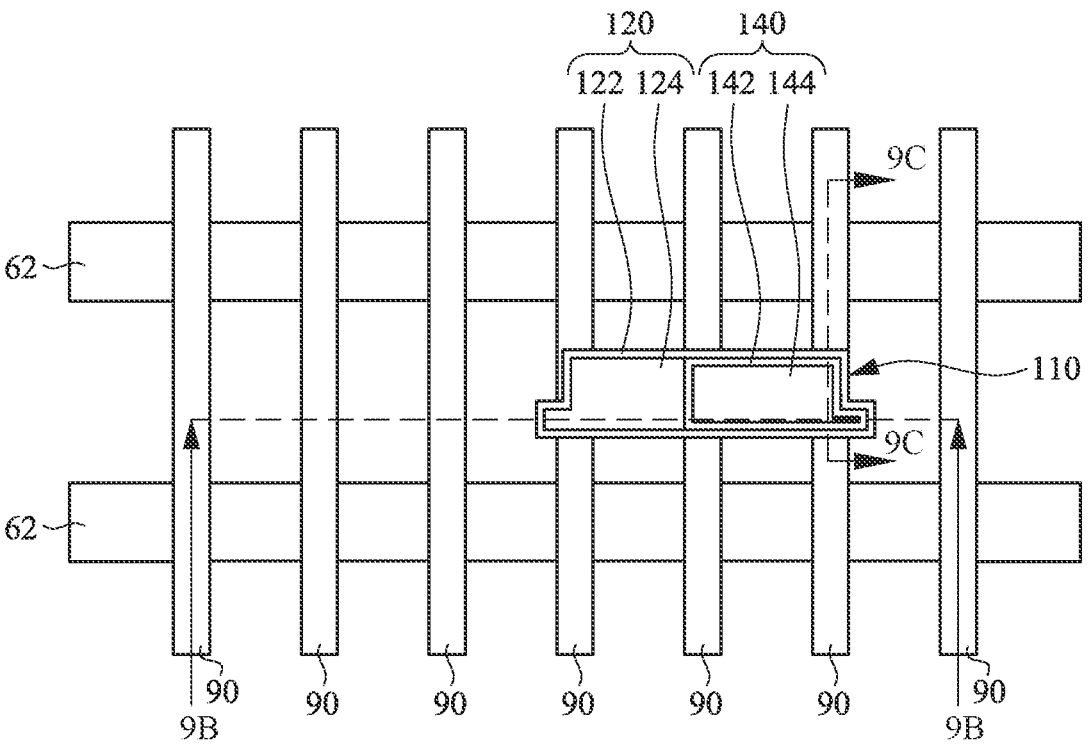
Figure 9B:
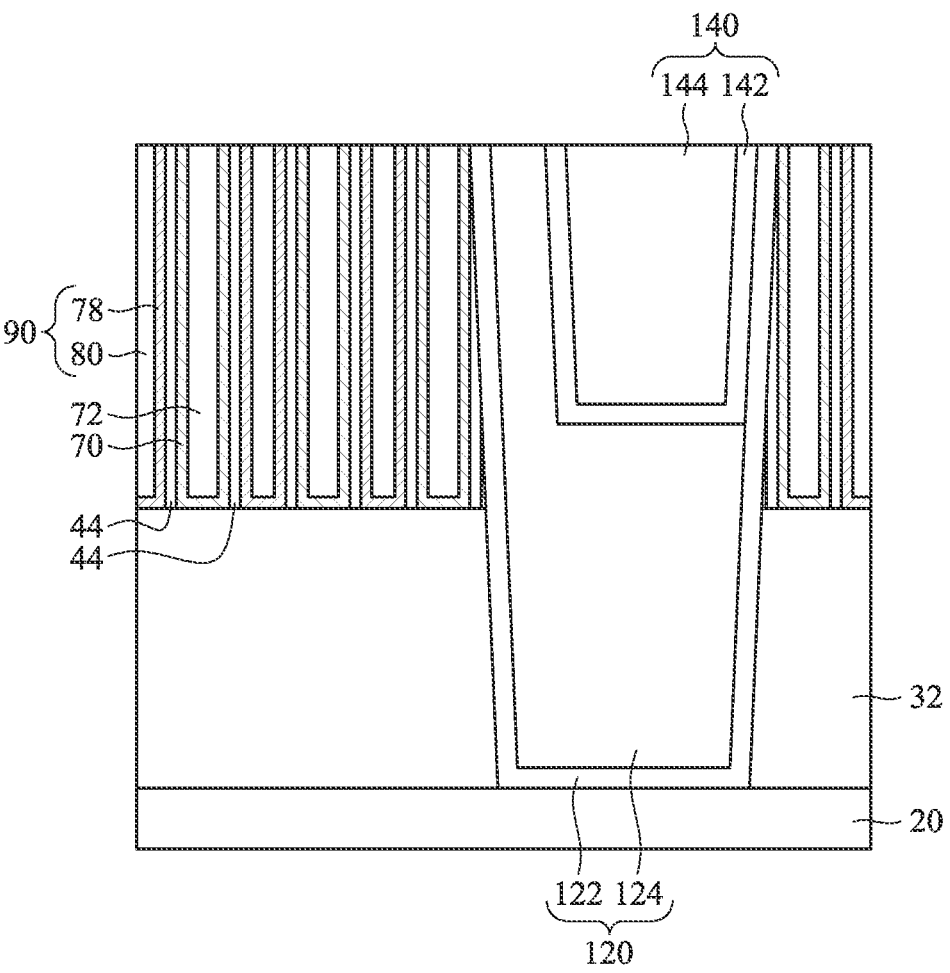
Figure 9C:
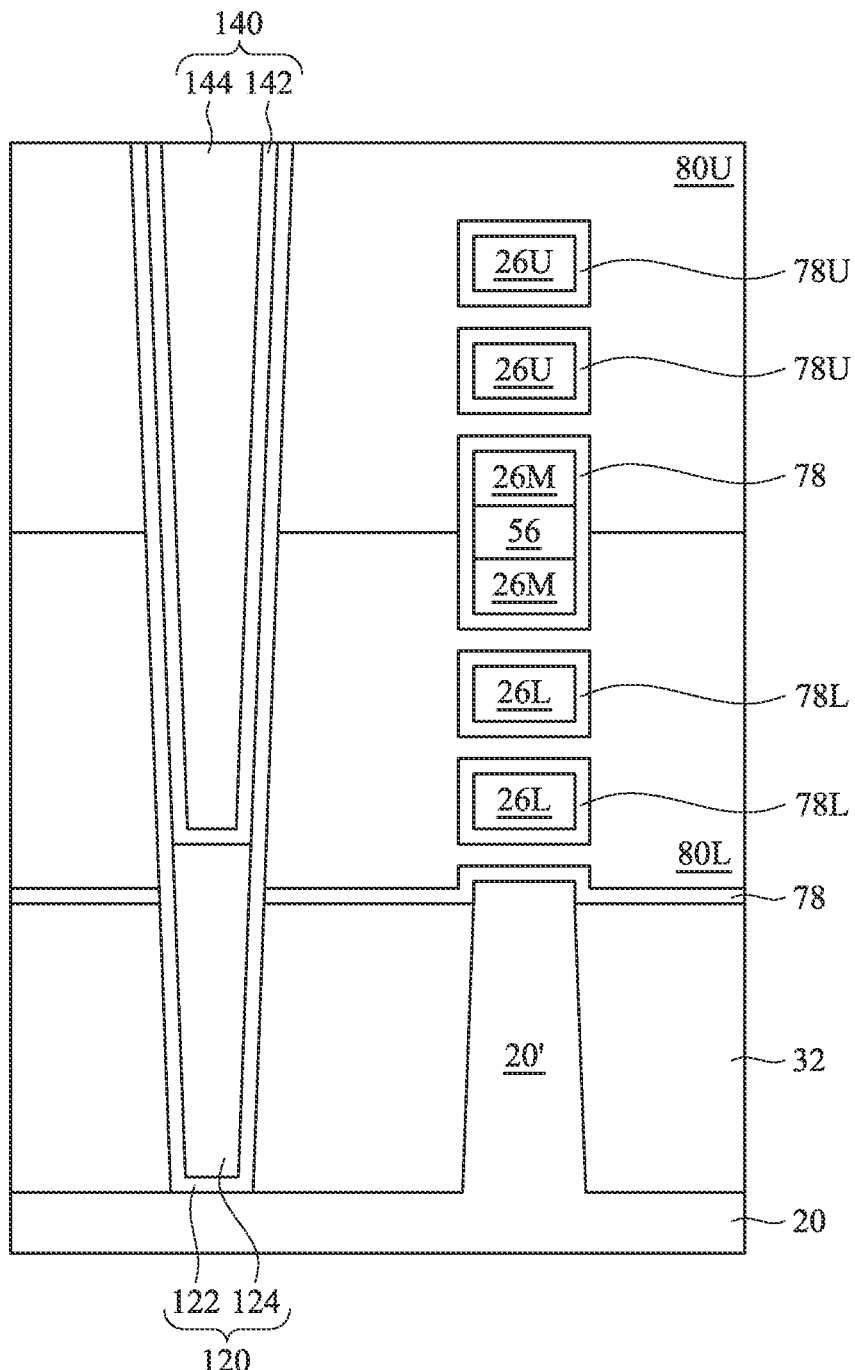

After the dielectric material 144 are formed, polish processes PP3 and PP4 may be performed to the hard mask layer 160, the dielectric liner 142 and the dielectric material 144, wherein the arrows of the polish processes PP3 and PP4 as illustrated in FIG. 7B for clarification present polish regions of the polish processes PP3 and PP4, respectively. The polish process PP3 may stop at a level of the polish stop layer 164 as illustrated in FIGS. 8A and 8B. FIGS. 8A and 8B illustrate the cross-sectional views of an intermediate stage in the formation of CFETs in accordance with some embodiments, wherein FIGS. 8A and 8B illustrate the polish process PP3 is performed to the structure as illustrated in FIGS. 7A and 7B and stops at a level of the polish stop layer 164. The polish process PP4 may start from the polish stop layer 164 and controllably stop at a top surface of the ILD layer 72, as illustrated in FIG. 9A through 9C. FIGS. 9A through 9C illustrate the top and cross-sectional views of an intermediate stage in the formation of CFETs in accordance with some embodiments, wherein FIGS. 9A through 9C illustrate a polish process is performed to the dielectric liner, the dielectric material and the remaining hard mask layer 160 having the polish stop layer 164 and the bottom mask layer 162 as illustrated in FIGS. 8A and 8B.

In some embodiments, the protective layer 166, the bottom mask layer 162 and the dielectric liner 142 include silicon nitride and the polish stop layer 164 includes amorphous silicon. A polish selectivity between the silicon nitride and the amorphous silicon in the polish process PP3 is greater than a polish selectivity between the silicon nitride and the amorphous silicon in the polish process PP4. The polish process PP3 has the large polish selectivity between the silicon nitride and the amorphous silicon, the polish process PP3 has a polish rate of the silicon-nitride protective layer 166 and a different polish rate of the amorphous-silicon polish stop layer 164 than the polish rate of the silicon-nitride protective layer 166, and the polish process PP3 may easily stop at the level of the polish stop layer 164. The polish process PP4 has the small polish selectivity between the silicon nitride and the amorphous silicon, the polish process PP4 has similar polish rates of the remaining silicon-nitride bottom mask layer 162 and dielectric liner 142 and remaining amorphous-silicon polish stop layer 164, so that the silicon-nitride bottom mask layer 162 and dielectric liner 142 and amorphous-silicon polish stop layer 164 can be polished uniformly to the top surface of the ILD layer 72.

After the polish process PP4 is performed, the hard mask layer 160 is removed. The excess portions of the dielectric liner 142 and the dielectric material 144 are removed, forming the upper surface of the metal-filled opening substantially coplanar with a top surface of the ILD layer 72. As illustrated in FIGS. 9A through 9C, the remaining dielectric liner 142 and dielectric material 144 in the trench 130 forms the isolation structure 140 in the L-shaped VLI structure.

Figure 10A:
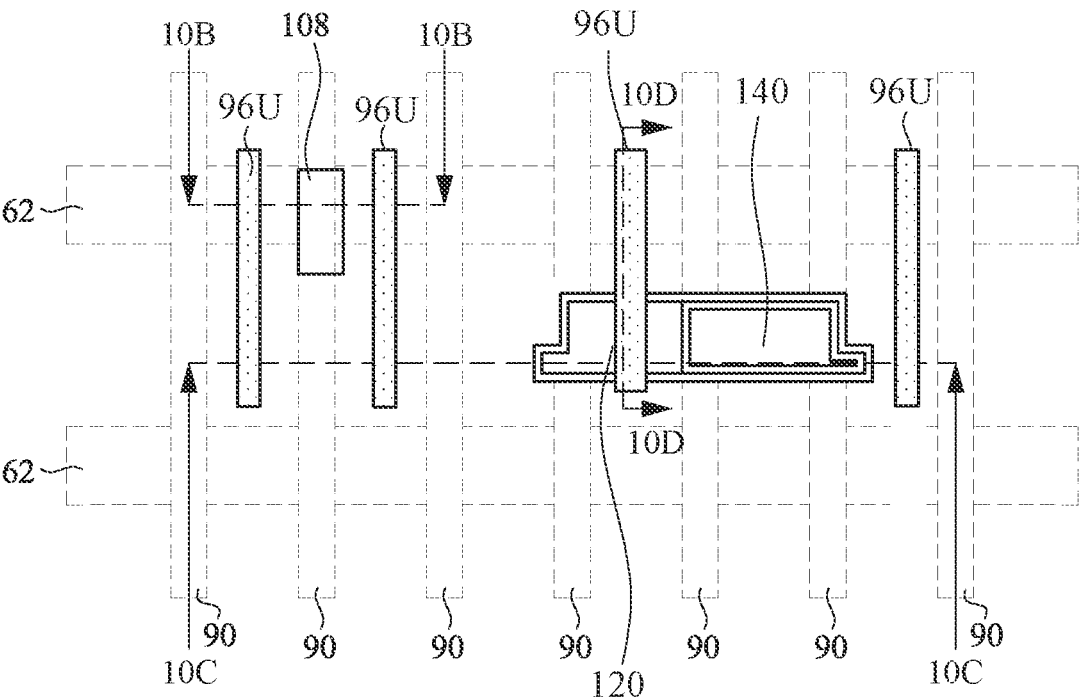
Figure 10B:
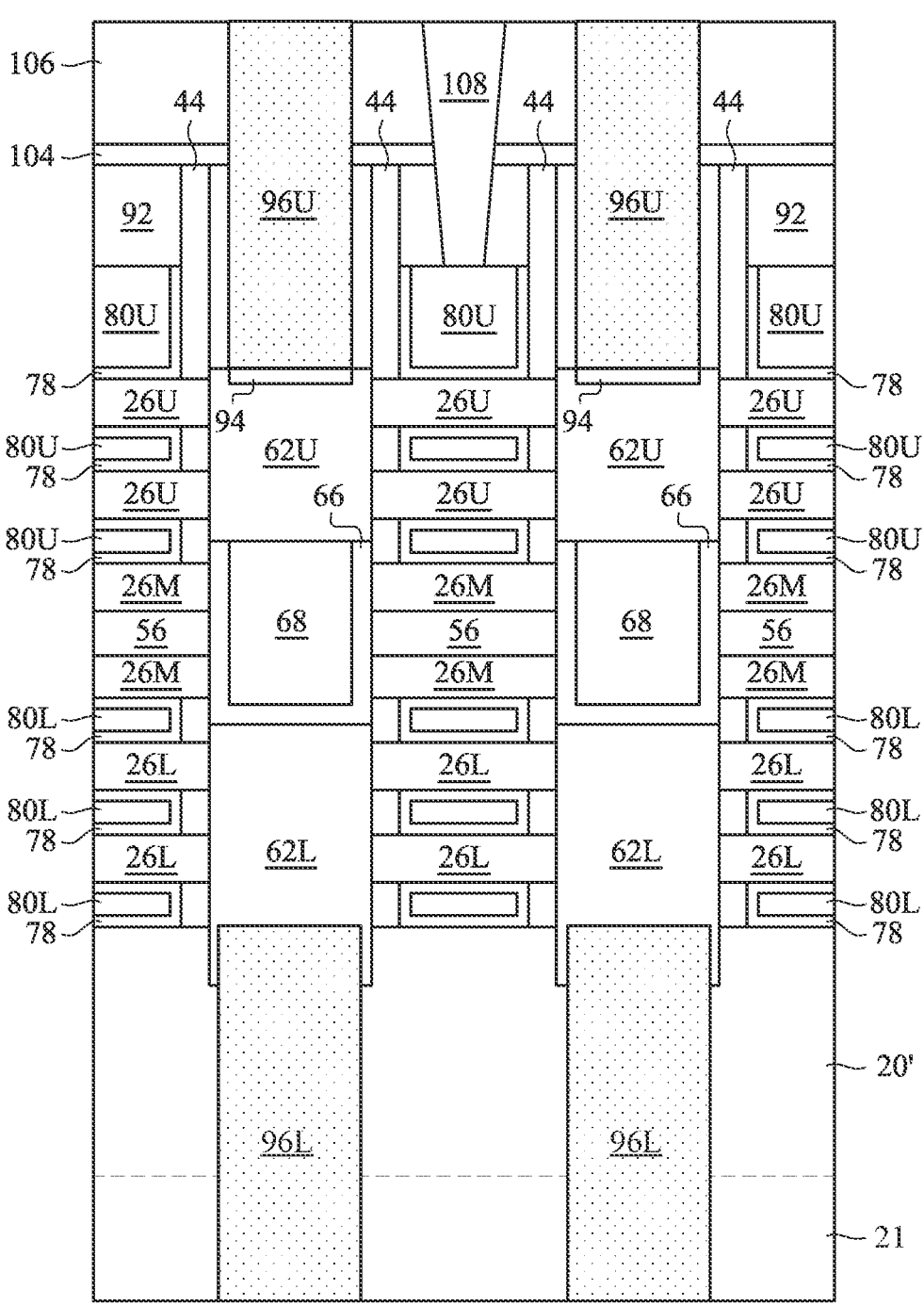
Figure 10C:
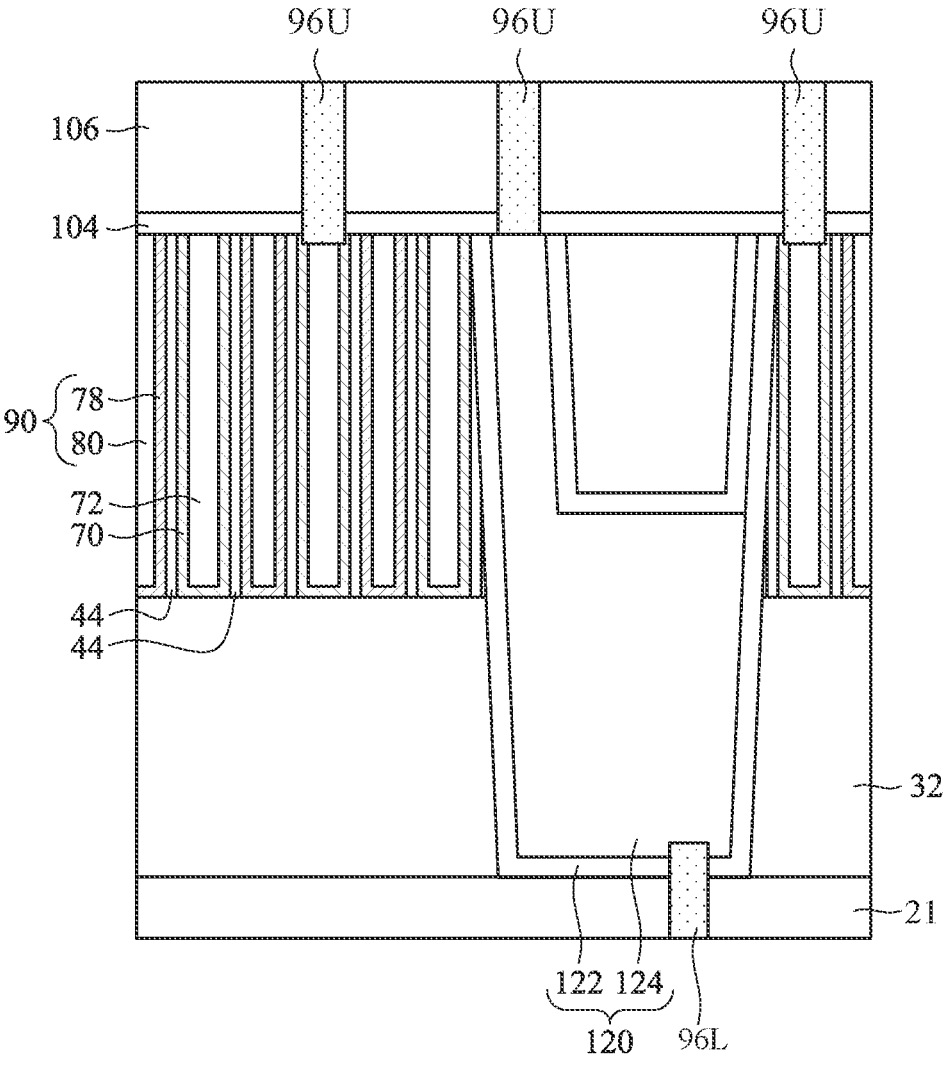

FIGS. 10A through 10D illustrate the top and cross-sectional views of an intermediate stage in the formation of CFETs in accordance with some embodiments, wherein FIGS. 10A through 10D illustrate forming gate contacts 108 and source/drain contacts 96U and 96L over the structure as illustrated in FIGS. 9A through 9C. FIG. 10A illustrates a schematic top view in accordance with some embodiment. FIG. 10B illustrates a vertical cross-section that is perpendicular to the longitudinal axis of the gate stacks 90. In FIGS. 10A-10D, a CESL 104 and an ILD layer 106 is formed over the structure as shown in FIGS. 9A-9C, front-side source/drain contacts 96U are then formed through the CESL 104 and an ILD layer 106 to the upper source/drain regions 62U, the substrate 20 is then removed (e.g., by grinding or CMP) and then replaced with a backside dielectric layer 21, and then backside source/drain contacts 96L are formed through the backside dielectric layer 21 to the lower source/drain regions 62L. The backside source/drain contacts 96L may be between fin spacers 31. As illustrated in FIG. 10C, a top surface of the conductive material 124 of the VLI structure 120 is in contact with a front-side source/drain contact 96U, and a bottom surface of the conductive material 124 of the VLI structure 120 is in contact with a backside source/drain contact 96L, and thus the VLI structure 120 can electrically connect an upper source/drain 62U to a lower source/drain region 62L.

Figure 10D:
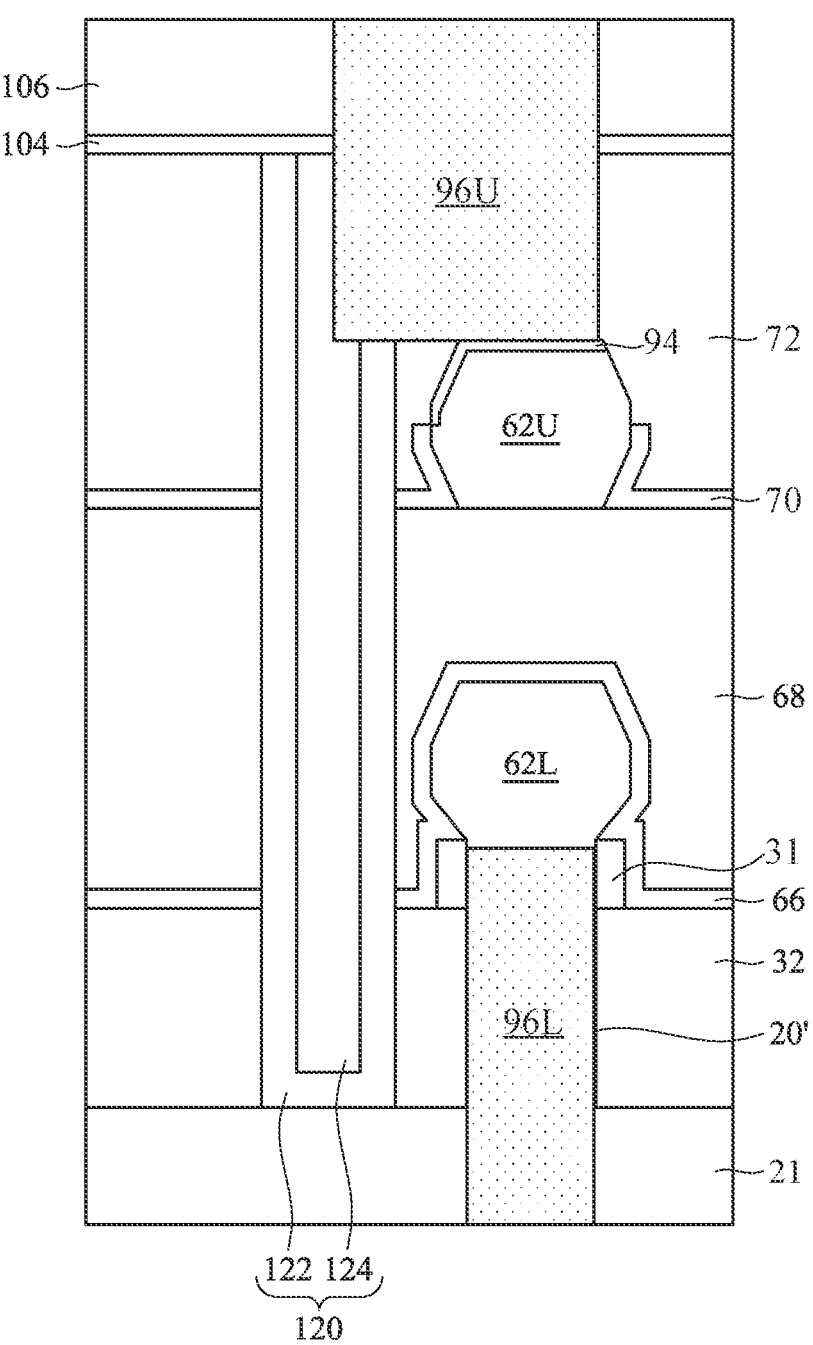

As illustrated in FIGS. 10B through 10D, a CESL 104 is formed over the second CESL 70, the second ILD 72, the gate spacers 44, the gate mask 92, the VLI structure 120, and the isolation structure 140. The ILD layer 106 is formed over the CESL 104. Subsequently, openings aligned with the upper source/drain epitaxial regions 62U, the VLI structure 120 and the gate electrodes 80U are formed and extend through the ILD layer 106. The gate contacts 108 are formed in the openings through the ILD layer 106 to electrically couple to the gate electrodes 80U. Silicide regions 94 and source/drain contacts 96U are formed to electrically couple to the source/drain regions 62U, wherein the source/drain contacts 96U are formed in the openings through the ILD layer 106 and the second ILD layer 72 and extend to the silicide regions 94 formed in the upper source/drain epitaxial regions 62U. In FIGS. 10B through 10D, the source/drain contacts 96U are also electrically coupled to the VLI structure 120. In FIGS. 10B through 10D, the substrate 20 is replaced by a backside dielectric layer 21. Source/drain contacts 96L are subsequently formed through the backside dielectric layer 21 and electrically coupled to the lower source/drain epitaxial regions 62L and the VLI structure 120. Therefore, one of the upper source/drain epitaxial regions 62U of the upper FET 10U can be electrically connected to one of the upper source/drain epitaxial regions 62L of the lower FET 10L by the VLI structure 120 to form a CFET semiconductor device. In some embodiments, the gate contacts 108 and the source/drain contacts 96U and 96L may include conductive seed liners and conductive material over the conductive seed liners in the openings.

According to one or more embodiments of the present disclosure, a method of forming a semiconductor device includes a number of operations. A bottom transistor is formed and a top transistor overlapping the bottom transistor is formed. A vertical local interconnect (VLI) structure is formed and electrically connects a source/drain region of the bottom transistor and a source/drain region of the top transistor. A hard mask layer is formed over the VLI structure, wherein the hard mask layer includes a bottom nitride layer, a top nitride layer and an amorphous semiconductive layer directly between the bottom nitride layer and the top nitride layer. The hard mask layer is patterned. A trench is formed in the VLI structure. An isolation structure is formed in the trench. A first polishing process is performed to the isolation structure and the hard mask layer, wherein the first polishing process stops the amorphous semiconductive layer. A second polish process is performed to the isolation structure, the bottom nitride layer and the amorphous semiconductive layer. In one or more embodiments of the present disclosure, before the first polishing process is performed, a thickness of the isolation structure and the top nitride layer higher than the amorphous semiconductive layer is greater than a thickness of the amorphous semiconductive layer and the bottom nitride layer. In one or more embodiment of the present disclosure, the first polishing process polishes the top nitride layer at a first polish rate, and polishes the amorphous semiconductive layer at second polish rate, and the first polish rate is different from the second polish rate. In one or more embodiment of the present disclosure, the top nitride layer and the bottom nitride layer include silicon nitride. In one or more embodiment of the present disclosure, the amorphous semiconductive layer includes amorphous semiconductive silicon. In one or more embodiment of the present disclosure, forming the hard mask layer further includes forming an oxide layer over the top nitride layer. In some embodiments, a thickness of the oxide layer is greater than a thickness of any of the top nitride layer, the amorphous semiconductive layer and the bottom nitride layer after the hard mask layer is formed. In some embodiments, the isolation structure is formed and extends from a top surface of the oxide layer into the trench before the first polish process is performed. In one or more embodiment of the present disclosure, forming the isolation structure includes forming a liner through the amorphous semiconductive layer of the hard mask layer and in the trench of the VLI structure. In one or more embodiment of the present disclosure, the first polishing process has a first polish selectivity between the top nitride layer and the amorphous semiconductive layer, the second polishing process has a second polish selectivity between the bottom nitride layer and the amorphous semiconductive layer, and the second polish selectivity is less than the first polish selectivity.

According to one or more embodiments of the present disclosure, a method of forming a semiconductor device includes a number of operations. A first transistor is formed and a second transistor is formed over the first transistor. A first hard mask layer is formed over the second transistor, wherein the first hard mask layer comprises a bottom nitride layer, a top nitride layer and an amorphous semiconductive layer directly between the bottom nitride layer and the top nitride layer. The first hard mask layer is patterned. A vertical local interconnect (VLI) structure is formed in the first trench and electrically connects a source/drain region of the first transistor to a source/drain region of the second transistor. A first polishing process is performed to the VLI structure and the first hard mask layer, wherein the first polishing process stops at a level of the amorphous semiconductive layer. After the first polishing process stops, a second polish process is performed to the VLI structure, the bottom nitride layer and the amorphous semiconductive layer. In one or more embodiments of the present disclosure, a thickness of the top nitride layer is greater than a thickness of the amorphous semiconductive layer and the bottom nitride layer. In one or more embodiments of the present disclosure, the top nitride layer and the bottom nitride layer comprise silicon nitride. In one or more embodiments of the present disclosure, the amorphous semiconductive layer comprises amorphous semiconductive silicon. In one or more embodiments of the present disclosure, forming the VLI structure comprises forming a nitride liner through the top nitride layer, the amorphous semiconductive layer and the bottom nitride layer of the first hard mask layer. In one or more embodiments of the present disclosure, the method further includes a number of operations. A second hard mask layer is formed over the VLI structure, wherein the second hard mask layer comprises a bottom nitride layer, a top nitride layer and an amorphous semiconductive layer directly between the bottom nitride layer and the top nitride layer. The second hard mask layer is patterned. A second trench is formed in the VLI structure. An isolation structure is formed in the second trench. A third polishing process is performed to the isolation structure and the second hard mask layer.

According to one or more embodiments of the present disclosure, a method of forming a semiconductor device includes a number of operations. A first transistor and a second transistor are formed, wherein the second transistor overlaps the first transistor. A hard mask layer is formed over the second transistor. Forming the hard mask layer including forming a bottom mask layer, forming an oxygen-free polish stop layer over the bottom mask layer, forming a protective layer over the oxygen-free polish stop layer and forming an oxide layer over the protective layer. The hard mask layer is patterned. A trench is formed in gate structures of the first and second transistors. An oxygen-free liner is formed in the trench. An oxide insulating layer is formed over the oxygen-free liner. A polishing process is performed to the hard mask, the oxygen-free liner and the oxide insulating layer, wherein the polishing process stops at a level of the oxygen-free polish stop layer. In one or more embodiments of the present disclosure, the hard mask layer comprises an oxide-free material. In one or more embodiments of the present disclosure, the polish process has a first polish rate on the protective layer and a second polish rate on the oxygen-free polish stop layer, the first polish rate is different from the second polish rate. In one or more embodiments of the present disclosure, the oxygen-free polish stop layer comprises amorphous silicon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a bottom transistor and a top transistor overlapping the bottom transistor;
    forming a vertical local interconnect (VLI) structure electrically connecting a source/drain region of the bottom transistor and a source/drain region of the top transistor;
    forming a hard mask layer over the VLI structure, wherein the hard mask layer comprises a bottom nitride layer, a top nitride layer and an amorphous semiconductive layer directly between the bottom nitride layer and the top nitride layer;
    patterning the hard mask layer;
    forming a trench in the VLI structure;
    forming an isolation structure in the trench;
    performing a first polishing process to the isolation structure and the hard mask layer, wherein the first polishing process stops the amorphous semiconductive layer; and
    performing a second polish process to the isolation structure, the bottom nitride layer and the amorphous semiconductive layer.

2. The method of claim 1, wherein before the first polishing process is performed, a thickness of the isolation structure and the top nitride layer higher than the amorphous semiconductive layer is greater than a thickness of the amorphous semiconductive layer and the bottom nitride layer.

3. The method of claim 1, wherein the first polishing process polishes the top nitride layer at a first polish rate, and polishes the amorphous semiconductive layer at second polish rate, and the first polish rate is different from the second polish rate.

4. The method of claim 1, wherein the top nitride layer and the bottom nitride layer comprise silicon nitride.

5. The method of claim 1, wherein the amorphous semiconductive layer comprises amorphous semiconductive silicon.

6. The method of claim 1, wherein forming the hard mask layer further comprises forming an oxide layer over the top nitride layer.

7. The method of claim 6, wherein a thickness of the oxide layer is greater than a thickness of any of the top nitride layer, the amorphous semiconductive layer and the bottom nitride layer after the hard mask layer is formed.

8. The method of claim 6, wherein the isolation structure is formed and extends from a top surface of the oxide layer into the trench before the first polish process is performed.

9. The method of claim 1, wherein forming the isolation structure comprises forming a liner through the amorphous semiconductive layer of the hard mask layer and in the trench of the VLI structure.

10. The method of claim 1, wherein the first polishing process has a first polish selectivity between the top nitride layer and the amorphous semiconductive layer, the second polishing process has a second polish selectivity between the bottom nitride layer and the amorphous semiconductive layer, and the second polish selectivity is less than the first polish selectivity.

11. A method, comprising:
    forming a first transistor and a second transistor over the first transistor;
    forming a first hard mask layer over the second transistor, wherein the first hard mask layer comprises a bottom nitride layer, a top nitride layer and an amorphous semiconductive layer directly between the bottom nitride layer and the top nitride layer;
    patterning the first hard mask layer;
    forming a first trench extending through gate structures of the first transistor and the second transistor;
    forming a vertical local interconnect (VLI) structure in the first trench, the VLI structure electrically connecting a source/drain region of the first transistor to a source/drain region of the second transistor;
    performing a first polishing process to the VLI structure and the first hard mask layer, wherein the first polishing process stops at a level of the amorphous semiconductive layer; and
    after the first polishing process stops, performing a second polish process to the VLI structure, the bottom nitride layer and the amorphous semiconductive layer.

12. The method of claim 11, wherein a thickness of the top nitride layer is greater than a thickness of the amorphous semiconductive layer and the bottom nitride layer.

13. The method of claim 11, wherein the top nitride layer and the bottom nitride layer comprise silicon nitride.

14. The method of claim 11, wherein the amorphous semiconductive layer comprises amorphous semiconductive silicon.

15. The method of claim 11, wherein forming the VLI structure comprises forming a nitride liner through the top nitride layer, the amorphous semiconductive layer and the bottom nitride layer of the first hard mask layer.

16. The method of claim 11, further comprising:
    forming a second hard mask layer over the VLI structure, wherein the second hard mask layer comprises a bottom nitride layer, a top nitride layer and an amorphous semiconductive layer directly between the bottom nitride layer and the top nitride layer;
    patterning the second hard mask layer;
    forming a second trench in the VLI structure;
    forming an isolation structure in the second trench; and
    performing a third polishing process to the isolation structure and the second hard mask layer.

17. A method comprising:

forming a first transistor and a second transistor, wherein the second transistor overlaps the first transistor;

forming a hard mask layer over the second transistor, comprising:

forming a bottom mask layer;

forming an oxygen-free polish stop layer over the bottom mask layer;

forming a protective layer over the oxygen-free polish stop layer; and forming an oxide layer over the protective layer;

patterning the hard mask layer;

forming a trench in gate structures of the first and second transistors;

forming an oxygen-free liner in the trench;

forming an oxide insulating layer over the oxygen-free liner; and performing a polishing process to the hard mask, the oxygen-free liner and the oxide insulating layer, wherein the polishing process stops at a level of the oxygen-free polish stop layer.

18. The method of claim 17, wherein the hard mask layer comprises an oxide-free material.

19. The method of claim 17, wherein the polish process has a first polish rate on the protective layer and a second polish rate on the oxygen-free polish stop layer, the first polish rate is different from the second polish rate.

20. The method of claim 17, wherein the oxygen-free polish stop layer comprises amorphous silicon.

* * * * *